| 
US008742506B2

(12) United States Patent  
Asano et al.

(10) Patent No.: US 8,742,506 B2  
(45) Date of Patent: Jun. 3, 2014

(54) PROTECTING ELEMENT HAVING FIRST AND SECOND HIGH CONCENTRATION IMPURITY REGIONS SEPARATED BY INSULATING REGION

(75) Inventors: Tetsuro Asano, Ora-gun (JP); Mikito Sakakibara, Saitama (JP); Toshikazu Hirai, Gunma (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/475,375

(22) Filed: May 18, 2012

(65) Prior Publication Data

US 2012/0228738 A1 Sep. 13, 2012

(30) Foreign Application Priority Data

Sep. 9, 2002 (JP) ................. 2002-262844

(51) Int. Cl.
*H01L 29/861* (2006.01)
(52) U.S. Cl.
USPC ..... 257/355; 257/275; 257/528; 257/E29.327
(58) Field of Classification Search
USPC ........... 257/355, 379, 409, 532, 275, 528, 257/E29.327
See application file for complete search history.

(56) References Cited

U.S. PATENT DOCUMENTS

| | | | |
|---|---|---|---|
| 4,261,004 A | 4/1981 | Masuhara et al. |
| 4,339,285 A | 7/1982 | Pankove |
| 4,387,386 A | 6/1983 | Garver |
| 4,626,802 A | 12/1986 | Gailus |
| 4,745,445 A | 5/1988 | Mun et al. |
| 4,803,527 A | 2/1989 | Hatta et al. |
| 4,843,440 A | 6/1989 | Huang |
| 4,965,863 A | 10/1990 | Cray |
| 5,047,355 A | 9/1991 | Huber et al. |
| 5,157,573 A | 10/1992 | Lee et al. |
| 5,371,405 A | 12/1994 | Kagawa |
| 5,374,899 A | 12/1994 | Griffiths et al. |
| 5,559,363 A | 9/1996 | Immorlica, Jr. |
| 5,654,860 A | 8/1997 | Casper et al. |

(Continued)

FOREIGN PATENT DOCUMENTS

| CN | 1492585 | 4/2004 |
|---|---|---|
| DE | 33 34 167 | 4/1985 |

(Continued)

OTHER PUBLICATIONS

Miyawaki, Yasuo et al., (1986) "Ion-Implanted Low Noise Dual Gate GaAs MESFEET," Sanyo Technical Review 18(2); 76-84.

(Continued)

*Primary Examiner* — Anh Mai

(57) ABSTRACT

With a microwave FET, an incorporated Schottky junction capacitance or PN junction capacitance is small and such a junction is weak against static electricity. However, with a microwave device, the method of connecting a protecting diode cannot be used since this method increases the parasitic capacitance and causes degradation of the high-frequency characteristics. In order to solve the above problems, a protecting element, having a first $n^+$-type region-insulating region-second $n^+$-type region arrangement is connected in parallel between two terminals of a protected element having a PN junction, Schottky junction, or capacitor. Since discharge can be performed between the first and second $n^+$ regions that are adjacent each other, electrostatic energy that would reach the operating region of an FET can be attenuated without increasing the parasitic capacitance.

15 Claims, 24 Drawing Sheets

(56) References Cited

U.S. PATENT DOCUMENTS

| | | | |
|---|---|---|---|
| 5,684,323 | A | 11/1997 | Tohyama |
| 5,821,827 | A | 10/1998 | Mohwinkel et al. |
| 5,841,184 | A | 11/1998 | Li |
| 5,932,917 | A | 8/1999 | Miura |
| 5,986,863 | A | 11/1999 | Oh |
| 6,002,860 | A | 12/1999 | Voinigescu et al. |
| 6,265,756 | B1 | 7/2001 | Brockett et al. |
| 6,580,107 | B2 | 6/2003 | Asano et al. |
| 6,914,280 | B2 | 7/2005 | Asano et al. |
| 6,946,891 | B2 | 9/2005 | Asano et al. |
| 7,193,255 | B2 | 3/2007 | Asano |
| 7,339,210 | B2 | 3/2008 | Asano et al. |
| 2002/0024375 | A1 | 2/2002 | Asano et al. |
| 2002/0047177 | A1 | 4/2002 | Asano et al. |
| 2004/0077150 | A1 | 4/2004 | Tosaka |
| 2004/0130380 | A1 | 7/2004 | Asano et al. |
| 2004/0222469 | A1 | 11/2004 | Asano et al. |
| 2004/0223274 | A1 | 11/2004 | Asano et al. |
| 2005/0121730 | A1 | 6/2005 | Asano et al. |
| 2005/0263796 | A1 | 12/2005 | Asano |
| 2005/0274979 | A1 | 12/2005 | Asano |
| 2005/0277255 | A1 | 12/2005 | Asano |
| 2005/0285143 | A1 | 12/2005 | Asano |
| 2006/0151816 | A1 | 7/2006 | Asano et al. |
| 2006/0163609 | A1 | 7/2006 | Asano et al. |
| 2006/0163659 | A1 | 7/2006 | Asano et al. |
| 2006/0164150 | A1 | 7/2006 | Asano |
| 2006/0252651 | A1 | 11/2006 | Asano et al. |
| 2006/0255403 | A1 | 11/2006 | Asano et al. |
| 2006/0289963 | A1 | 12/2006 | Asano et al. |

FOREIGN PATENT DOCUMENTS

| | | |
|---|---|---|
| EP | 0 140 095 | 5/1985 |
| EP | 0 700 161 | 3/1996 |
| JP | 57-128983 | 8/1982 |
| JP | 60-86874 | 5/1985 |
| JP | 62-174975 | 7/1987 |
| JP | 02-162744 | 6/1990 |
| JP | 8-236549 | 9/1996 |
| JP | 2723936 | 11/1997 |
| JP | 11-220093 | 8/1999 |
| JP | 2002-368194 | 12/2002 |
| JP | 2004-103786 | 4/2004 |
| KR | 1998-043416 | 9/1998 |
| KR | 1998-065222 | 10/1998 |
| KR | 2002-0093613 | 12/2002 |
| WO | WO-96/22613 | 7/1996 |
| WO | WO-97/45877 | 12/1997 |

OTHER PUBLICATIONS

S.M. Sze. (1981) Physics of Semiconductor Devices. New York: john Wiley & Sons. 2:116-123.

European Search Report dated Dec. 3, 2008 directed towards foreign application No. 02788677.9; 4 pages.

Anderson, W.R. et al. "ESD Protection under Wire Bonding Pads," EOS/ESD Symposium, Jan. 1, 1999, pp. 88-94.

European Office Action directed towards a counterpart EP application No. 02788677.9 mailed Mar. 5, 2009; (5 pages).

European Search Report dated Jul. 6, 2009 directed towards foreign application No. 03794280.2; (3 pages).

European Search Report dated Sep. 21, 2009 directed towards EP Patent Application No. 03 794 280.2; (6 pages).

Asano, T., U.S. Patent Office Action, mailed Feb. 5, 2009, directed to U.S. Appl. No. 11/314,101; 7 pages.

Asano, T., U.S. Patent Office Action, mailed Jun. 11, 2008, directed to U.S. Appl. No. 11/314,101; 9 pages.

Asano, T., U.S. Patent Office Action, mailed Jan. 25, 2006, directed to U.S. Appl. No. 10/772,585; 7 pages.

Asano, T., U.S. Patent Office Action, mailed Sep. 6, 2006, directed to U.S. Appl. No. 10/772,585; 7 pages.

Asano, T., U.S. Patent Office Action, mailed Aug. 11, 2009, directed to U.S. Appl. No. 10/521,941; 5 pages.

Asano, T., U.S. Patent Office Action, mailed Mar. 30, 2009, directed to U.S. Appl. No. 10/521,941; 8 pages.

Asano, T., U.S. Patent Office Action, mailed Oct. 8, 2008, directed to U.S. Appl. No. 10/521,941; 8 pages.

Asano, T., U.S. Patent Office Action, mailed Sep. 18, 2006, directed to U.S. Appl. No. 10/505,438; 15 pages.

Asano, T., U.S. Patent Office Action, mailed Mar. 2, 2006, directed to U.S. Appl. No. 10/505,438; 14 pages.

Asano, T., U.S. Patent Office Action, mailed Jan. 6, 2009, directed to U.S. Appl. No. 11/314,178; 11 pages.

Asano, T., U.S. Patent Office Action, mailed Jul. 17, 2008, directed to U.S. Appl. No. 11/314,178; 13 pages.

Comparison of spreading of currents and recombination

|  | a-structure | | | b-structure-1 | | | b-structure-2 | | |
|---|---|---|---|---|---|---|---|---|---|
|  | y__2 | x__0 | Product | y__2 | x__0 | Product | y__2 | x__0 | Product |
| Electron current density | 21.9 | 10.5 | 230.0 | 26 | 15 | 390.0 | 23.8 | 11.3 | 268.9 |
| Hole current density | y__2 | x__0 | | y__2 | x__0 | | y__2 | x__0 | |
|  | 13.7 | 6 | 82.2 | 23.9 | 12.5 | 298.8 | 12.7 | 7.4 | 94.0 |
| Recombination density | y__2 | x__0 | | y__2 | x__0 | | y__2 | x__0 | |
|  | 29.7 | 14.8 | 439.6 | 33.1 | 20 | 662.0 | 33.9 | 15.5 | 525.5 |

| b-structure-3 | | |
|---|---|---|
| y__2 | x__0 | Product |
| 69 | 36.1 | 2490.9 |
| y__2 | x__0 | |
| 47.9 | 29.1 | 1393.9 |
| y__2 | x__0 | |
| 80 or more | 43.9 | 3512 or more |

PROTECTING ELEMENT HAVING FIRST AND SECOND HIGH CONCENTRATION IMPURITY REGIONS SEPARATED BY INSULATING REGION

This application is a continuation of U.S. patent application Ser. No. 10/505,438, filed Aug. 24, 2004, which is a national stage application under 35 USC 371 of International Application No. PCT/JP2003/11419, filed Sep. 8, 2003, which claims priority from Japanese Application No. 2002-262844, filed Sep. 9, 2002, the entire contents of which are incorporated herein by reference.

BACKGROUND OF THE INVENTION

1. Field of the Invention

This invention relates to a protecting element and especially relates to a protecting element that significantly improves the electrostatic breakdown voltage without degrading the high-frequency characteristics of a protected element.

2. Description of the Related Art

FIG. 11 show equivalent circuit diagrams of semiconductor devices with junctions or capacitors.

FIG. 11A is an equivalent circuit diagram of a GaAs MESFET, FIG. 11B is that of a bipolar transistor, and FIG. 11C is that of a MOSFET.

As shown by these diagrams, in considering the electrostatic breakdown voltage, any semiconductor device may be expressed as an equivalent circuit composed of diodes, capacitors, and resistors (inductors may be included in the case of a high-frequency device).

Also, a diode may express a PN junction or a Schottky junction. For example, the diodes of a GaAs MESFET are Schottky barrier diodes and the diodes of a bipolar transistor are PN junction diodes.

Generally with related-art semiconductor devices, the method of connecting an electrostatic breakdown protecting diode in parallel to a device containing a PN junction, Schottky junction, or capacitor that is easily damaged by electrostatic discharge may be considered for protection of the device from static electricity.

SUMMARY OF THE INVENTION

As mentioned above, generally for protection of a device from static electricity, the method of connecting an electrostatic breakdown protecting diode in parallel to the device containing a PN junction, Schottky junction, or capacitor that is easily damaged by electrostatic discharge may be considered. However, this method cannot be applied to a microwave device since increased parasitic capacitance due to connection of a protecting diode causes degradation of the high-frequency characteristics.

Thus unlike other devices for audio, video, and power supply applications, microwave communication devices are low in the internal Schottky junction capacitance, PN junction capacitance, or gate MOS capacitance and had a problem of these junctions being weak against static electricity. Capacitors integrated in microwave integrated circuits are also low in capacitance value and weak against electrostatic discharge.

This invention has been made in view of the various circumstances described above and provides a solution first by providing an arrangement having a first high concentration impurity region, a second high concentration impurity region, and an insulating region disposed in contact with and between the first and second high concentration impurity regions and arranging the first and second high concentration impurity regions as two terminals connected in parallel between two terminals of a protected element having a PN junction or Schottky junction so as to make electrostatic energy applied between the abovementioned two terminals of the protected element be discharged between the first and second high concentration impurity regions and thereby attenuate the electrostatic energy.

This invention provides a solution secondly by providing an arrangement having a first high concentration impurity region, a second high concentration impurity region, and an insulating region disposed in contact with and between the first and second high concentration impurity regions and arranging the first and second high concentration impurity regions as two terminals connected in parallel between two terminals of a protected element forming a capacitor so as to make electrostatic energy applied between the two terminals of the protected element be discharged between the first and second high concentration impurity regions and thereby attenuate the electrostatic energy.

DESCRIPTION OF THE EMBODIMENT OF THE INVENTION

Embodiments of this invention shall now be described in detail using FIG. 1 through FIG. 10.

Figure 1:
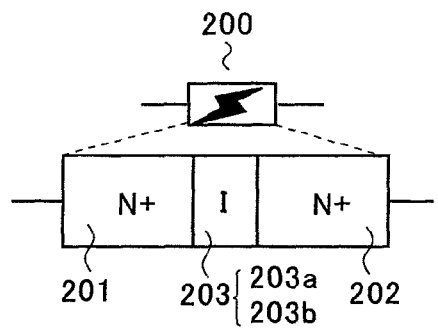
FIG. 1 is a schematic diagram for describing this invention.

FIG. 1 is a schematic view showing a protecting element.

As illustrated, a protecting element 200 of this specification is an element in which an insulating region 203 is disposed between the two terminals of a first high concentration impurity region 201 and a second high concentration impurity region 202 that are disposed close to each other. The first and second high concentration impurity regions 201 and 202 are formed by ion implantation and diffusion in a substrate 201. In this specification, these high concentration impurity regions shall be described hereinafter as the first n$^+$-type region 201 and the second n$^+$-type region 202. The first and second n$^+$-type regions 201 and 202 are separated by a distance that enables passage of electrostatic energy, for example, a distance of approximately 4 μm, and for both, the impurity concentration is $1 \times 10^{17}$ cm$^{-3}$ or more. The insulating region 203 is disposed in contact with and between the first and second n$^+$-type regions 201 and 202. Here, the insulating region 203 is not completely insulating in electrical terms but is a part 203a of a semi-insulating substrate or an insulated region 203b that has been made insulated by ion implantation of an impurity into the substrate 201. The insulating region 203 preferably has an impurity concentration of $1 \times 10^{14}$ cm$^{-3}$ or less and a resistivity rate of $1 \times 10^3$ Ω·cm or more.

By disposing the high concentration impurity regions 201 and 202 in contact with the respective ends of the insulating region 203 and making the distance between the two high concentration impurity regions 201 and 202 approximately 4 μm, electrostatic energy, which is applied from the outside between two terminals of a protected element to which the two high concentration impurity regions 201 and 202 are respectively connected, can be discharged via the insulating region 203.

The distance of 4 μm between these two n$^+$-type regions is a suitable distance for passage of electrostatic energy, and with an separation of 10 μm or more, discharge will not occur reliably across the protecting element. The same applies to the impurity concentration of the n$^+$-type regions and the resistance value of the insulating region.

Under a normal FET operation, since a voltage as high as that of static electricity will not be applied, a signal will not pass through the insulating region of 4 μm. Likewise, a signal will not pass through the insulating region of 4 μm even with a high-frequency wave, such as a microwave. Thus the under normal operation, the protecting element is equivalent to being non-existent since it does not influence the characteristics in any way. However, static electricity is a phenomenon in which a high voltage is applied instantaneously, and in this case, electrostatic energy passes through the insulating region of 4 μm and is discharged between the high concentration impurity regions. Also, when the thickness of the insulating region becomes 10 μm or more, the resistance becomes large even for static electricity and discharge becomes less likely to occur.

These first n$^+$-type region 201 and second n$^+$-type region 202 are connected in parallel between two terminals of a protected element. The first and second n$^+$-type regions 201 and 202 may be used as they are as the terminals of the protecting element 200 or metal electrodes 204 may be provided additionally.

Figure 2A:
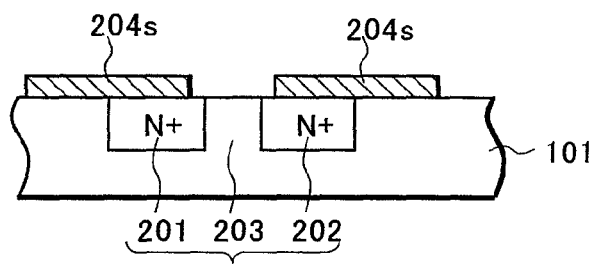
FIG. 2A is a sectional view for describing this invention.
Figure 2B:
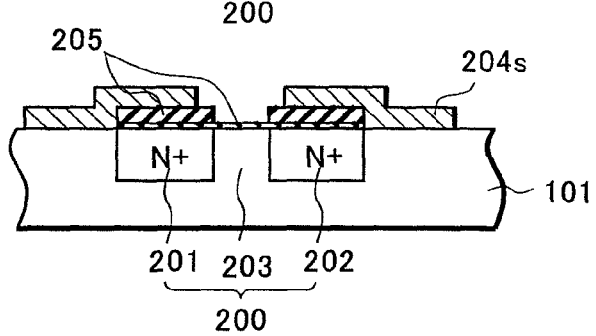
FIG. 2B is a sectional view for describing this invention.
Figure 2C:
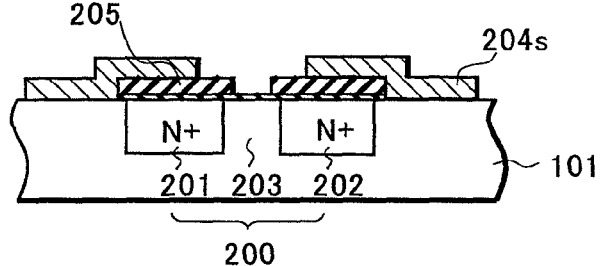
FIG. 2C is a sectional view for describing this invention.
Figure 2D:
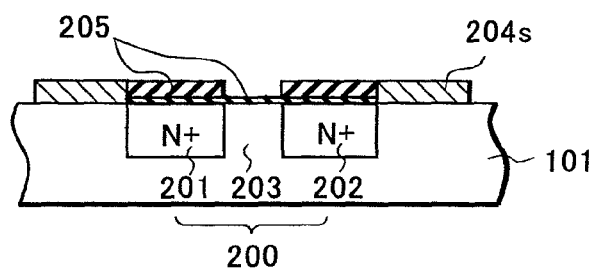
FIG. 2D is a sectional view for describing this invention.
Figure 3A:
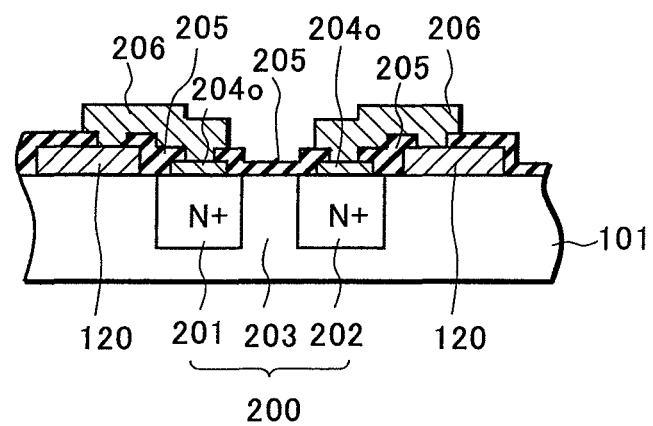
FIG. 3A is a sectional view for describing this invention.

Cases where metal electrodes 204 are provided are illustrated in FIG. 2 and FIG. 3. Such a metal electrode 204 is connected to a bonding pad or a wiring connected to a bonding pad that is connected to a terminal of, for example, a MESFET 100, which is the protected element. FIG. 2 shows the metal electrodes 204 that form Schottky junctions with the first and second n$^+$-type regions 201 and 202, and FIG. 3 shows the metal electrodes 204 that form ohmic junctions. Here for the sake of convenience, these metal electrodes shall be described as Schottky junction metal electrodes 204s and ohmic junction metal electrodes 204o.

In FIG. 2A, the metal electrodes 204s form Schottky junctions with the surfaces of the first n$^+$-type region 201 and/or second n$^+$-type region 202. The electrodes are formed on the surfaces of the first and second n$^+$-type regions 201 and 202, and are separated by 0.1 μm to 5 μm from the insulating region 203 ends in consideration of the mask aligning accuracy and the resistances of both n$^+$ regions 201 and 202. An alienation of 5 μm or more will make the resistance large and will not readily allow the passage of static electricity. The metal electrodes 204s may be formed on just the first and second n$^+$-type regions 201 and 202 or a part thereof may extend to a semi-insulating substrate 101 and form a Schottky junction with the substrate surface.

Or as shown in FIGS. 2B and 2C, the metal electrodes 204s may be disposed on passivation nitride films or other insulating films 205 on the first and second n$^+$-type regions 201 and 202. In this case, the metal electrodes 204s are extended onto the semi-insulating substrate 101 and are connected via the substrate 101 to the first and second n$^+$-type regions 201 and 202. Furthermore, as shown in FIG. 2D, a structure, in which a metal layer is not formed on either of the n$^+$-type regions 201 and 202 but the metal electrodes 204s form Schottky junctions with the semi-insulating substrate 101 at the outer sides of these regions, is also possible.

In all of the cases illustrated in FIGS. 2B, 2C, and 2D, the metal electrodes 204s are not connected directly with the first and/or second n$^+$-type regions 201 and 202. The metal electrodes 204s may thus have structures that form Schottky junctions with the substrate approximately 0 μm to 5 μm to the outer side from the ends of the first and/or second n$^+$-type regions 201 and 202. That is, as shown in FIGS. 2B, 2C, and 2D, the first and second n$^+$-type regions 201 and 202 do not have to be in contact with the metal electrodes 204s, and if they are within the distance of 5 μm, an adequate connection between the n⁺-type regions and the metal electrodes 204s can be secured via the semi-insulating substrate.

Meanwhile, FIG. 3 shows the metal electrodes 204o that form ohmic junctions with the first and/or second n⁺-type regions.

The metal electrodes 204o may form ohmic junctions with the first and/or second n⁺-type regions 201 and 202. Since the metal electrodes 204o cannot form ohmic junctions with the semi-insulating substrate 101, the metal electrodes 204o are not extended onto neighboring parts of the substrate 101 in this case. The metal electrode 204o is connected to a bonding pad (or a wiring connected to the bonding pad) 120 of the protected element, and in the case of an ohmic junction, the metal electrode 204o is connected to a pad (or a wiring) 120 via another metal layer 206.

An ohmic junction is lower in resistance than a Schottky junction and passes static electricity more readily. In this regard, an ohmic junction provides a larger protection effect against electrostatic breakdown than a Schottky junction.

However, with an ohmic junction, an ohmic electrode metal 204o is diffused deeply into the substrate and when the ohmic electrode metal 204o reaches the depth of the high concentration layer or more, the ohmic electrode metal 204o contacts the semi-insulating region of the substrate and in this case, the protecting element 200 itself readily undergoes electrostatic breakdown.

For example, if a metal is provided to form ohmic junctions with both the first n⁺ region 201 and the second n⁺ region 202, the distance between ohmic junctions is 10 μm, and the ohmic electrode metal 204o is diffused to the semi-insulating region of the substrate at the depth of the n⁺ regions 201 and 202 or more, an ohmic junction-insulating region-ohmic junction structure is formed at region deeper than the depth of the N⁺ regions, and since it is known that this structure is weak against electrostatic energy, the possibility that the protecting element itself will undergo electrostatic breakdown arises in this case.

Thus in a case where the ohmic electrode metal 204o is diffused to the semi-insulating region of the substrate at the depth of the two n⁺ regions or more, Schottky junctions must be formed instead, and in a case where the ohmic electrode metal 204o does not reach the depth of the n⁺ regions, ohmic junctions provide a greater protection effect.

Figure 3B:
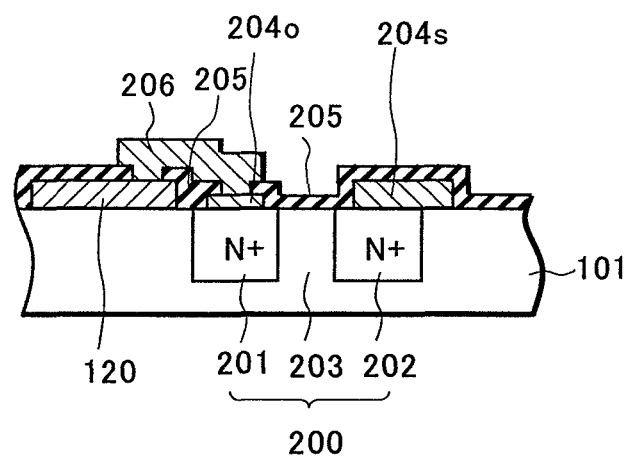
FIG. 3B is a sectional view for describing this invention.

Also, as shown in FIG. 3B, it is not necessary for both of the two terminals of the protecting element 200 to have the same metal electrode structure and each of the first and second n⁺-type regions may have any of the structures shown in FIG. 2 and FIG. 3 individually. Furthermore, although an arrangement is possible that one of the terminals has the metal electrode 204 and the other terminal does not have the metal electrode 204, the provision of metal electrodes is preferable in that the resistance is decreased and the protection effect is increased correspondingly.

Such a metal electrode 204 may be a part of a bonding pad or a part of a wiring connected to a bonding pad, and as shall be described in detail later, by using such bonding pads and wiring, the chip area can be prevented from increasing due to the connection of the protecting element 200.

Figure 4A:
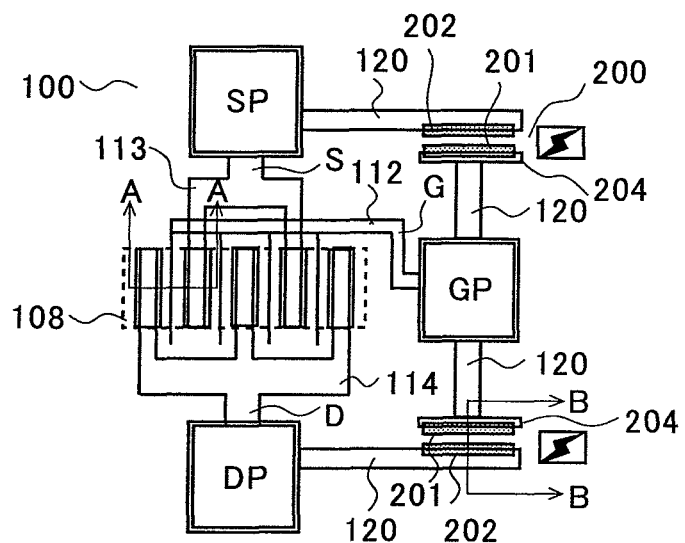
FIG. 4A is a plan view for describing this invention.
Figure 4B:
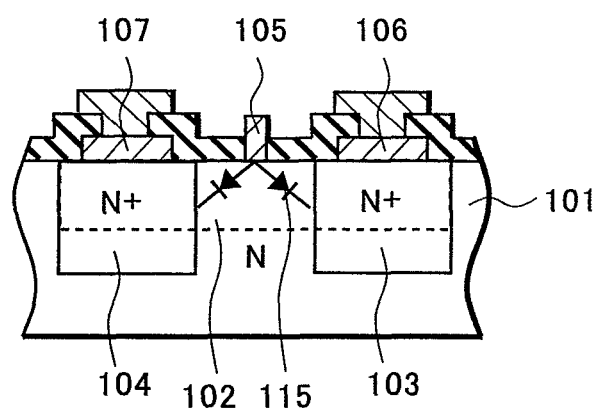
FIG. 4B is a sectional view for describing this invention.
Figure 4C:
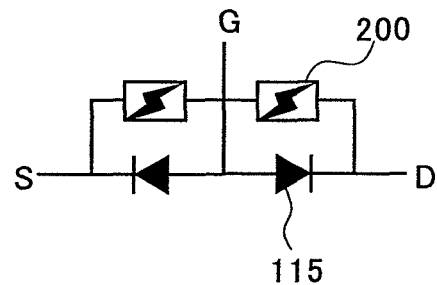
FIG. 4C is an equivalent circuit diagram for describing this invention.

FIG. 4 shows a first embodiment of a protecting element connection example in which a GaAs MESFET is the protected element. FIG. 4A is a plan view, FIG. 4B is a sectional view along line A-A of FIG. 4A, and FIG. 4C is an equivalent circuit diagram of FIG. 4A.

As shown in FIGS. 4A and 4B, a protected element 100 is a MESFET having a gate electrode 105, which forms a Schottky junction with an operating layer 102 disposed on a GaAs surface that is the semi-insulating substrate 101, a source region 103 and a drain region 104, which are formed of high-concentration impurity regions disposed at the respective ends of the operating layer 102, and a source electrode 106 and a drain electrode 107, which form ohmic junctions with the surfaces of the abovementioned regions. Here, the operating layer 102 and the source and drain regions 103 and 104, to which the respective electrodes are connected, shall be referred to as an "operating region 108" of the FET, which is indicated by broken lines in FIG. 4A.

With this specification, the gate electrode 105, the source electrode 106, and the drain electrode 107 within the FET operating region 108 are connected via a gate wiring 112, a source wiring 113, and a drain wiring 114 to a gate pad GP, a source pad SP, and a drain pad DP, respectively. Also the respective parts at which gate wiring 112, source wiring 113, and drain wiring 114 are converged and lead to the corresponding pads shall be referred to as a gate terminal G, a source terminal S, and a drain terminal D.

With regard to the terminals, although illustration shall be omitted here, the protected element 100 does not have to have all of the gate pad GP, the source pad SP, and the drain pad DP and there may be cases where terminals exist even though pads are not disposed. For example, with a two-stage amp MMIC, in which two FETs are integrated, pads do not exist but terminals exist for the drain of the first stage FET and the gate of the subsequent stage FET.

The respective wiring 112, 113, and 114 are not restricted to metal wiring and may be resistors formed by an n⁺ layer, etc. Also, the respective bonding pads SP, DP, and GP corresponding to the respective electrodes inside the operating region 108 are not restricted to being connected by uniform wiring but resistors, capacitors, inductors, etc., may be inserted in the middle of the wiring. That is, all cases, where some form of electrical signal, be it DC, AC, or high frequency, is transmitted between the respective electrodes within the operating region 108 and the corresponding bonding pads, are included.

Here as an example, the gate electrode 105, the source electrode 106, and the drain electrode 107 are respectively extended by the metal wiring 112, 113, and 114 and connected to the gate pad GP, the source pad SP, and the drain pad DP.

With a MESFET, the case that is weakest against electrostatic breakdown is the case where a surge voltage is applied between the gate terminal G and the source terminal S or between the gate terminal G and the drain terminal D, both of which are small in gate Schottky junction capacitance, with the gate terminal G side being made negative. In this case, static electricity is applied in reverse bias to Schottky barrier diodes 115 formed at the interface between the operating region 108 and the gate electrode 105, which is disposed on the surface of the operating region 108.

As shown in FIGS. 4B and 4C, when considering the electrostatic breakdown voltage in the GaAs MESFET 100, the gate Schottky junction is in a reverse bias state. That is, the equivalent circuit in this case is a circuit in which the Schottky barrier diodes 115 are connected between the gate terminal G and the source terminal S and between the gate terminal G and the drain terminal D.

For protection against electrostatic breakdown, electrostatic energy applied to the weak Schottky junctions of the gate electrode 105 should be reduced. Thus with this embodiment, the above-described the protecting element 200 is connected in parallel between two terminals of the MESFET 100 to form a path, which serves as a bypass that discharges a part of the electrostatic energy that is applied between the corresponding two terminals, to thereby protect the weak junction against electrostatic breakdown.

As shown in FIGS. 4A and 4C, with this embodiment, the protecting elements 200 are respectively connected in parallel between the source pad SP and the gate pad GP, that is, between the two terminals of the source terminal S and the gate terminal G, and between the drain pad DP and the gate pad GP, that is, between the two terminals of the drain terminal D and the gate terminal G. Electrostatic energy that is applied from the bonding pads connected to two terminals can be discharged partially inside the protecting elements 200 by using the respective wiring 120. That is, the electrostatic energy that reaches a gate Schottky junction in the FET operating region 108, which is weakest in electrostatic breakdown strength, is reduced to protect the FET 100 from electrostatic breakdown. Although the protecting elements 200 are connected to carry out discharge both between the gate terminal G and the drain terminal D and between the gate terminal G and the source terminal S, one of either protecting element 200 may be connected.

The sectional view along line B-B of the protecting element of FIG. 4A is the same as that of FIG. 2A. That is, with this specification, a connection of the protecting element 200 refers to the forming of the first $n^+$-type region 210 and the second $n^+$-type region 202 at a distance of 4 μm by implantation/diffusion on the surface of the semi-insulating substrate 101, on which the protected element 100 is formed, the connecting of the first $n^+$-type region 201 to one of the terminals of the FET, and the connecting of the second $n^+$-type region 202 to another terminal of the FET, and the protecting elements 200 and the MESFET 100, which is the protected element, are integrated in the same chip. In the case where the substrate surface is not semi-insulating, the insulated region 203 is formed by ion implantation of impurity between the two $n^+$-type regions 201 and 202.

Also, for the sake of description, the first $n^+$-type region 201 shall be the terminal of the protecting element 200 that is connected to the gate terminal G, which is one of the terminals of the FET 100, and the second $n^+$-type region 202 shall be the terminal of the protecting element 200 that is connected to the source terminal S or the drain terminal D, which is the other terminal of the FET 100, in this specification. That is, in FIG. 4A, two protecting elements 200 are connected to the FET 100 and the first $n^+$-type region 201 of each is connected via the metal electrode 204 to the gate pad GP and the second $n^+$-type region 202 is connected via the metal electrode 204 to the drain pad DP or the source pad SP. The metal electrodes 204 form Schottky junctions with the first and second $n^+$-type regions 201 and 202 and parts of the metal electrodes 204 are extended to the semi-insulating substrate 101 to form Schottky junctions with the substrate surface. The structure of the metal electrode 204 is only an example and may be that of either FIG. 2 or FIG. 3.

That is, each of these the protecting elements 200 has its first $n^+$-type region 201, which is to be one terminal, connected to the gate pad GP and its second $n^+$-type region 202, which is to be the other terminal, connected to the source pad SP or the drain pad DP via the wiring 120 that are connected to the respective pads and is thus connected in parallel between connections of FET, that is, between the gate terminal G and source terminal S or the gate terminal G and drain terminal D.

Electrostatic energy that is applied between the gate terminal G and source terminal S or between the gate terminal G and drain terminal D can thus be discharged partially in the protecting element 200. The electrostatic energy reaching gate Schottky junctions in the FET operating region that are weakest in electrostatic breakdown strength can thus be attenuated greatly, and the FET can be protected from electrostatic breakdown. Discharge is performed between the gate terminal G and source terminal S and between the gate terminal G and drain terminal D. Discharge may be performed only between one of the two paths. That is, by this structure, the electrostatic breakdown voltage of the FET can be improved significantly in comparison to a related-art structure that does not use a protecting element.

Conventionally, 100% of the electrostatic energy applied between the gate terminal G and source terminal S or between the gate terminal G and drain terminal D is transmitted to the operating region 108, with this invention, a part of the electrostatic energy is bypassed to the protecting element 200 by use of the respective wiring and bonding pads and discharged inside the protecting element 200. The electrostatic energy that is transmitted to the operating region 108 can thereby be attenuated to a level that does not exceed the electrostatic breakdown voltage between the gate electrode and source electrode or between the gate electrode and drain electrode of the operating region 108.

Figure 5A:
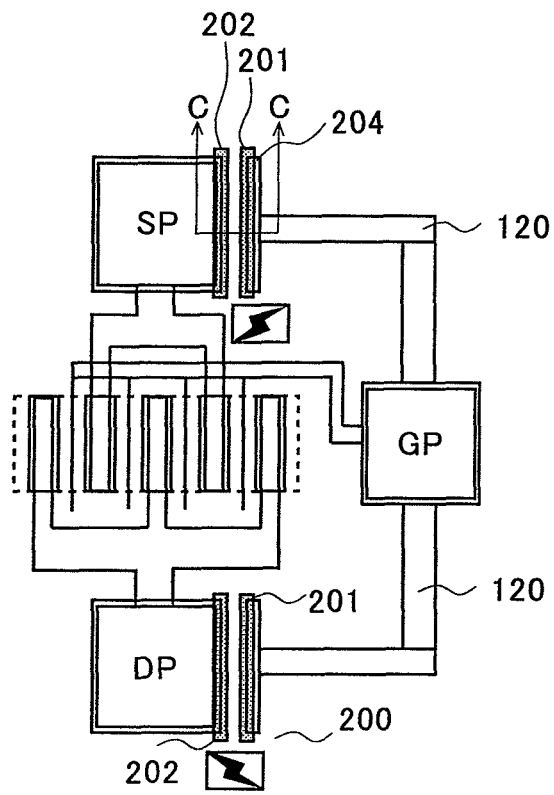
FIG. 5A is a plan view for describing this invention.
Figure 5B:
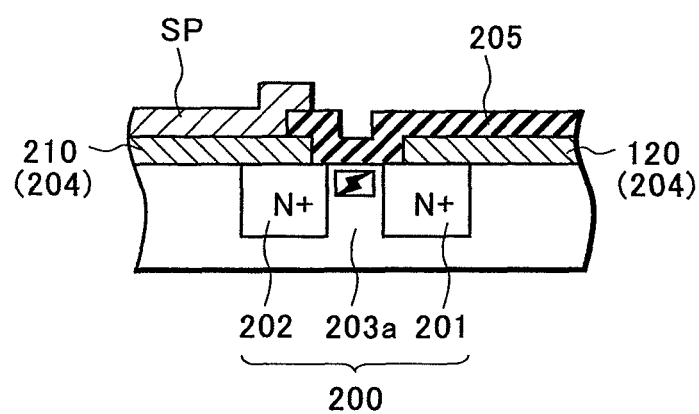
FIG. 5B is a sectional view for describing this invention.

FIG. 5 shows an example of using a bonding pad as the metal electrode of one of the terminals of a protecting element. FIG. 5A is a plan view, and FIG. 5B is a sectional view along line C-C.

In FIG. 4, the example, in which the wirings 120 are lead out from the source pad SP and the drain pad DP and the protecting elements 200 are connected to these wiring 120, was illustrated. FIG. 5 shows a structure wherein the second $n^+$-type regions 202, each forming a Schottky junction with a Schottky metal layer 210 of the lowermost layer of each bonding pad, are provided and a part of each of source pad SP and drain pad DP is used as the metal electrode 204 connected to the second $n^+$-type region 202. Each of the first $n^+$-type regions 201 is disposed so as to be adjacent the second $n^+$-type region 202 and is connected to the wiring 120 that is connected to the gate pad GP. By thus connecting the second $n^+$-type regions 202 directly to the source pad SP and the drain pad DP, which are connected to other terminals of the FET, and disposing the protecting elements 200 adjacent the respective pads, electrostatic energy can be discharged directly into the protecting elements 200 from the source and drain pads SP and DP, thereby providing a large improvement effect in terms of the electrostatic breakdown voltage, and furthermore since the space in the surroundings of the pads can be used effectively, the increase in the chip area due to the addition of the protecting elements 200 can be prevented.

Also, although not illustrated, by connecting the first $n^+$-type regions 201 directly to the gate pad GP and furthermore disposing the second $n^+$-type regions 202 adjacent the first $n^+$-type regions 201 and connecting them to the wiring 120 connected to the source pad SP and the drain pad DP, electrostatic energy can be discharged directly from the gate pad GP into the protecting element 200, thus likewise providing a large improvement effect in terms of the electrostatic breakdown voltage and yet preventing increase in the chip area due to the addition of the protecting elements 200.

Figure 6:
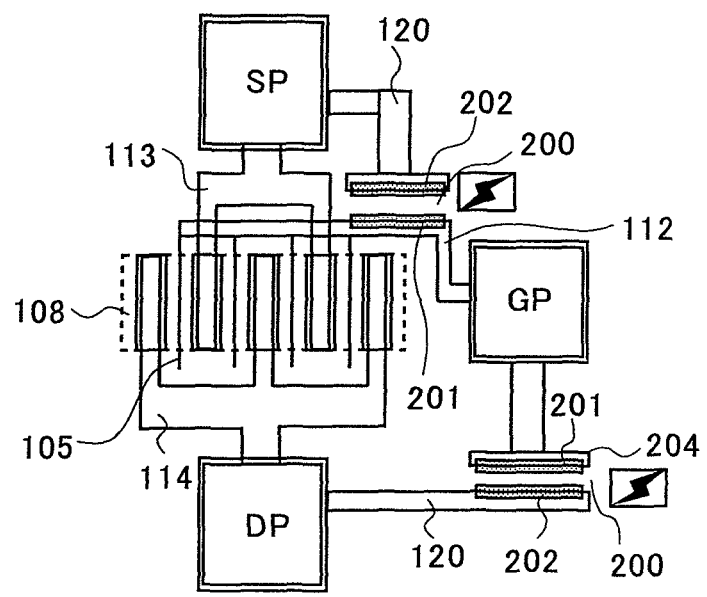
FIG. 6 is a plan view for describing this invention.

FIG. 6 shows an example of connecting the protecting element 200 in the middle of a signal path. As mentioned above, the Schottky junctions of the gate electrode 105 are weakest against electrostatic breakdown and the part that undergoes electrostatic breakdown most substantively is the gate electrode 105 part of the operating region 108. Thus by connecting a the protecting element 200 in the middle of a signal path from the gate pad GP to the gate electrode 105 of the operating region 108 as shown in FIG. 6, the most effective protection against electrostatic breakdown can be provided.

In this case, the first $n^+$-type region 201 is connected to a part of the gate wiring 112 leading from the gate pad GP to the operating region 108. The second $n^+$-type region 202 is connected to the source pad SP, the drain pad DP or the wiring 120 that is connected to either pad. For example, between the gate and the source of FIG. 6, in order to position the second $n^+$-type region 202 adjacent the first $n^+$-type region 201, the wiring 120 from the source pad SP is extended to the part of the second $n^+$-type region 202.

For example, by connecting the gate wiring 112 to the operating region 108 upon making it run adjacent the source pad SP or the drain pad DP, the protecting element 200 can be connected in the middle of a signal path and yet adjacent a pad of the FET to provide a more effective protection against electrostatic energy.

Also, the protecting element 200 is more effective when the length of the first and second $n^+$-type regions 201 and 202, which are the terminals, is longer. Since this length is preferably 10 μm or more for example, a part of a pad or wiring of a protected element is preferably used as the metal electrode 204 of the protecting element 200. For example, by connecting a protecting element along at least one side of a pad, effective connection can be made by making use of the space at the periphery of the pad.

Although an example of connecting protecting elements between the gate terminal G and source terminal S and between the gate terminal G and drain terminal D was described here since, with the FET, a gate Schottky junction or a gate PN junction is weakest against electrostatic breakdown, a protecting element may be connected in parallel between the source terminal S and drain terminal D.

Figure 7A:
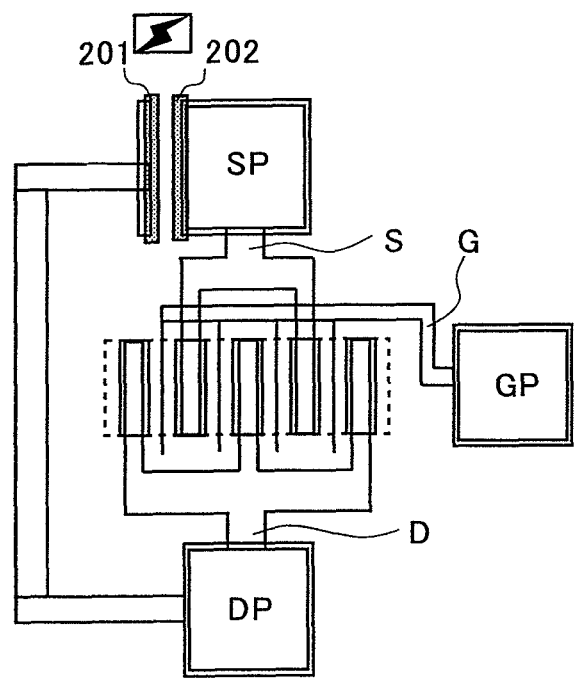
FIG. 7A is a plan view for describing this invention.

FIG. 7 show schematic diagrams of such a case. This connection example is just one example. In the case of this example, the second $n^+$-type region 202 is made the terminal of the protecting element 200 that is connected to the source pad SP and the first $n^+$-type region 201 is made the terminal of the protecting element 200 that is connected to the drain pad DP. The second $n^+$-type region is disposed at the periphery of the pad and the source pad SP is used as the metal electrode 204.

Figure 7B:
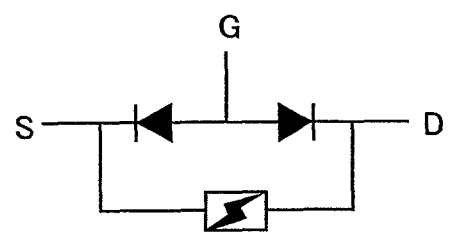
FIG. 7B is an equivalent circuit diagram view for describing this invention.

FIG. 7B shows the equivalent circuit diagram for this case. Here, an equivalent circuit, in which a Schottky barrier diode between the gate terminal G and the source terminal S and a Schottky barrier diode between the gate terminal G and the drain terminal D are connected in series, is protected. This protecting element connection is effective for example in a case where both the source electrode and the drain electrode respectively correspond to input and output terminals serving as entrance and exit for signals as in a switching circuit device.

In general, GaAs MESFETs are used in satellite broadcasting, cellular phone, wireless broadband applications, and other microwave applications of the GHz band or higher frequency. Thus in order to secure good microwave characteristics, the gate length is of the submicron order and the gate Schottky junction capacitance is designed to be extremely small. GaAs MESFETs were thus extremely weak against electrostatic breakdown and the finest care was necessary for handling devices including MMICs in which GaAs MESFETs are integrated. Furthermore, protecting diodes, which are widely employed for increasing the electrostatic breakdown voltage in general, consumers-use semiconductors for low frequency applications, such as audio, video, and power supply applications, have a PN junction and use thereof thus causes the parasitic capacitance to increase greatly by at least a few hundred fF or more. Such protecting diodes thus greatly degrade the microwave characteristics of a GaAs MESFET and therefore cannot be used.

However, since this invention's electrostatic breakdown protecting element does not have a PN junction and is of a capacitance of at the most a few dozen fF or less, it can greatly improve the electrostatic breakdown voltage without degrading the microwave characteristics of a GaAs MESFET.

Figure 8A:
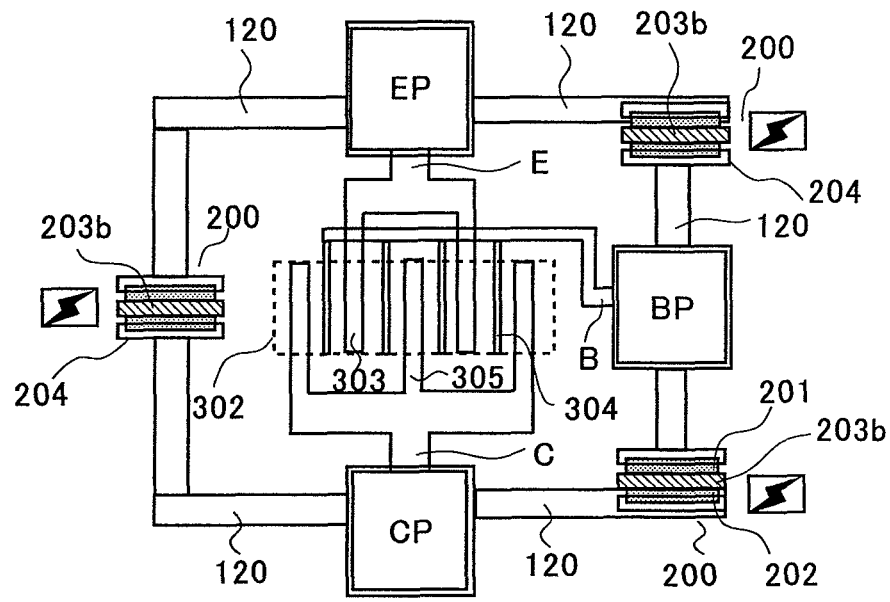
FIG. 8A is a plan view for describing this invention.

FIG. 8 and FIG. 9 show equivalent circuit diagrams of other protecting element connection examples. As mentioned above, this invention's protecting element can protect not only Schottky junctions but can also protect PN junctions as well.

FIG. 8 show a silicon bipolar transistor. An operating region 302 is formed for example by providing an N-type collector region, a P-type base region, and an N-type emitter region on a substrate and connecting a collector electrode 305, a base electrode 304, and an emitter electrode 303. The collector electrode 305, the base electrode 304, and the emitter electrode 303 are converged outside the operating region and become a collector terminal C, a base terminal B, and an emitter terminal E. Also, the collector terminal C, the base terminal B, and the emitter terminal E are connected to a collector pad CP, a base pad BP, and an emitter pad EP, respectively.

The protecting elements 200 are connected using the wiring 120 lead out from the emitter pad EP, base pad BP, and collector pad CP as the metal electrodes 204. Also, one of the terminals of the protecting element 200 may be connected directly to a pad or wiring by using a part of the pad or the wiring connected to the pad as the metal electrode 204 as shown in FIG. 5 and FIG. 6. Furthermore, one terminal of the protecting element 200 may be connected to a wiring, leading, for example, from the base pad, connected to the base terminal B, to the operating region. In this case, since the substrate is a silicon substrate, the insulating region 203 of the protecting element 200 is the insulated region 203b formed by ion implantation of impurity.

With such an NPN transistor, the base-emitter junction and the base-collector junction are respectively PN junctions and the collector-emitter junction is an NPN junction. In particular the emitter-base junction, which is a connection of high concentration layers with each other, is the weakest against electrostatic breakdown, and the emitter-collector junction is the next weakest. If in an integrated circuit, the base terminal B is not connected to a pad but the emitter terminal E and the collector terminal C are connected directly to pads, the emitter-collector junction will be the weakest against electrostatic breakdown.

Figure 8B:
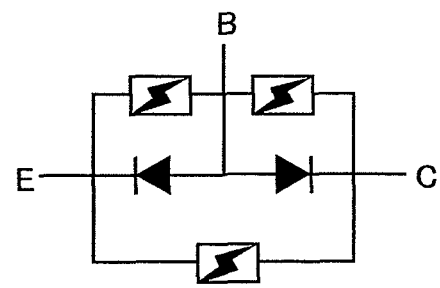
FIG. 8B is an equivalent circuit diagram view for describing this invention.

Protecting elements are thus connected in parallel to the base-emitter junction, base-collector junction, and collector-emitter junction, respectively, as shown in FIG. 8B. All PN junctions within a single element can thus be protected by protecting elements. Connecting a protecting element in parallel to the collector-emitter junction is equivalent to connecting the protecting element in parallel to the NPN junction.

In this figure, two protecting elements 200 are connected to emitter pad EP. A plurality of the protecting elements 200 may be connected to the same pad in this manner.

Figure 8C:
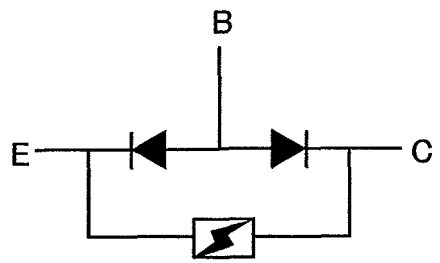
FIG. 8C is an equivalent circuit diagram view for describing this invention.

FIG. 8C shows an equivalent circuit diagram for the case in which a protecting element is connected only between the emitter and the collector of the protected element. Next to the base-emitter junction, the emitter-collector junction is weak against electrostatic breakdown. In many cases, the emitter is the GND and the collector is the output terminal, and in such a case, it is preferable to connect a protecting element between the emitter and the collector. There are also many cases where the base becomes the input terminal, and in such a case it is preferable to place a protecting element between the base and the emitter.

In recent years, rapid advances have been made towards providing silicon bipolar transistors with finer, three-dimensional structures, and by significant reductions of the parasitic capacitance and parasitic resistance, it has become possible to provide these transistors with microwave characteristics that only GaAs devices could provide conventionally. Silicon bipolar transistors have thus come to be used widely in low-noise amps and RF-block MMICs for cellular phones, wireless broadband, and other microwave applications of the GHz band. Thus as with GaAs MESFETs, the emitter width is reduced to the submicron order and the emitter-base junction capacitance and base-collector junction capacitance are designed to be extremely small in order to secure good microwave characteristics. Such transistors were thus extremely weak against electrostatic breakdown and the finest care was necessary for handling. Furthermore, protecting diodes, which are widely employed for increasing the electrostatic breakdown voltage in general, consumer-use semiconductors for low frequency applications, such as audio, video, and power supply applications, have a PN junction and use thereof thus causes the parasitic capacitance to increase greatly by at least a few hundred fF or more. Such protecting diodes thus greatly degrade the microwave characteristics of a silicon microwave bipolar transistor and therefore cannot be used.

However, since this invention's electrostatic breakdown protecting element does not have a PN junction and is of a capacitance of at the most a few dozen fF or less, it can greatly improve the electrostatic breakdown voltage without degrading the microwave characteristics of a silicon microwave bipolar transistor.

As a second embodiment of a protecting element connection example, an application to a capacitor shall be described with reference to FIG. 9.

Figure 9A:
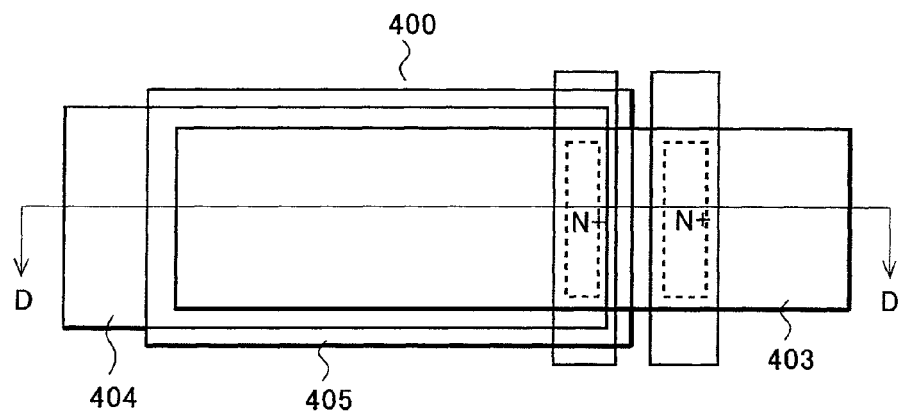
FIG. 9A is a plan view for describing this invention.
Figure 9B:
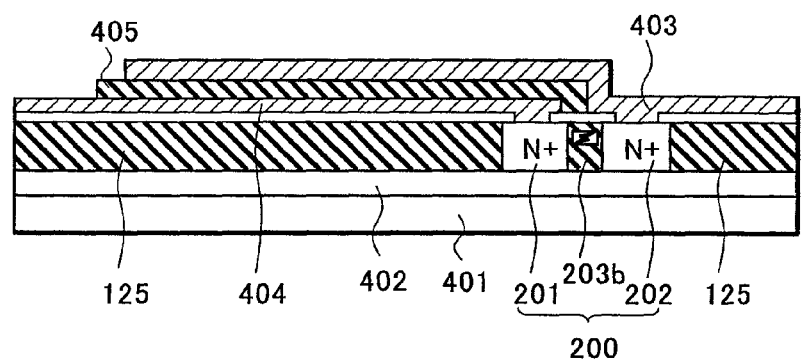
FIG. 9B is a sectional view for describing this invention.
Figure 9C:
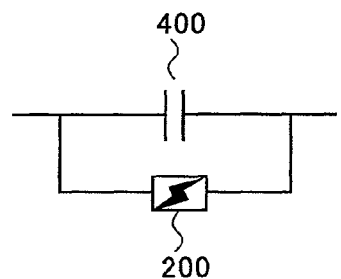
FIG. 9C is an equivalent circuit diagram for describing this invention.

FIG. 9A is a plan view of a capacitor incorporated in an integrated circuit, FIG. 9B is a sectional view along line D-D of FIG. 9A, and FIG. 9C is an equivalent circuit diagram. In this case, on the surface of a silicon substrate 401, provided with an embedded oxide film 402, the insulated region 203b is disposed between the first n+-type region 201 and the second n+-type region 202 to integrate the protecting element 200. A lower layer electrode 404 and an upper layer electrode 403 form ohmic junctions with the first $n^+$-type region 201 and the second $n^+$-type region 202, respectively. Between the upper layer electrode 403 and the lower layer electrode 404 is disposed an interlayer oxide film 405 that serves as a dielectric. Although conventionally, just the potentials of the upper layer electrode 403 and the lower layer electrode 404 were isolated by an the insulated layer 125 disposed on a substrate 401, by furthermore forming the protecting element 200 on the substrate 401 as in this embodiment, a structure in which the protecting element 200 is connected in parallel between the upper layer electrode 403 and the lower layer electrode 404 as shown in FIG. 9C is realized. In general, the interlayer oxide film 405 is thin and when electrostatic energy from the outside is applied between the upper layer electrode 403 and lower layer electrode 404, which are the two terminals of the capacitor, the interlayer oxide film 405 undergoes dielectric breakdown readily. Also, since a capacitor that is integrated in a microwave integration circuit is small in capacitance value, it undergoes dielectric breakdown even more readily. Thus by making a part of the electrostatic energy applied from the outside be discharged across the protecting element 200 and thereby reducing the electrostatic energy applied across the layers, the capacitor can be protected from dielectric breakdown.

Figure 10A:
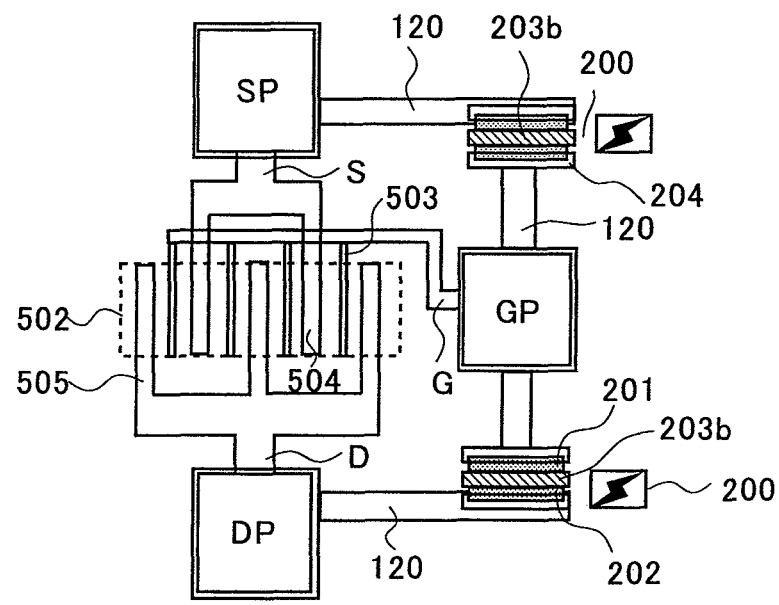
FIG. 10A is a plan view for describing this invention.
Figure 10B:
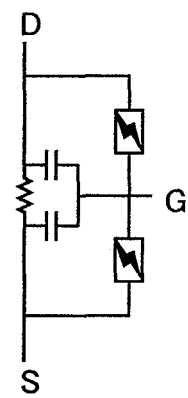
FIG. 10B is an equivalent circuit diagram for describing this invention.

FIG. 10 shows a MOSFET.

An operating region 502 is formed for example by providing an N-type drain region, an N-type source region, and a P-type channel region on a substrate and connecting a drain electrode 505, a source electrode 504, and a gate electrode 503. The drain electrode 505, source electrode 504, and gate electrode 503 are converged outside the operating region and become the drain terminal D, source terminal S, and gate terminal G. Also, the drain terminal D, source terminal S, and gate terminal G are connected to the drain pad DP, source pad SP, and gate pad GP, respectively.

The protecting elements 200 are connected using the wiring 120 lead out from the drain pad DP, source pad SP, and gate pad GP as the metal electrodes 204. Also, one of the terminals of the protecting element 200 may be connected directly to a pad or wiring by using a part of the pad or the wiring connected to the pad as a metal electrode 204 as shown in FIG. 5 and FIG. 6. Furthermore, one terminal of the protecting element 200 may be connected to a wiring, leading, for example, from the pad, connected to gate terminal G, to the operating region. In this case, since the substrate is a silicon substrate, the insulating region 203 of the protecting element 200 is the insulated region 203b formed by ion implantation of impurity.

With a MOSFET, a gate insulating film exists between the gate electrode and the operating region and forms a gate MOS capacitor. In terms of an equivalent circuit, capacitors exist between the gate and the source and between the gate and the drain. The gate insulating film is made extremely thin in order to improve the switching speed and the gate capacitor is weak against electrostatic breakdown.

Thus by connecting the protecting elements 200 in parallel between the gate and the source and between the gate and the drain of the MOSFET as shown in FIG. 10, the weak gate MOS capacitor can be protected from electrostatic breakdown.

Figure 10C:
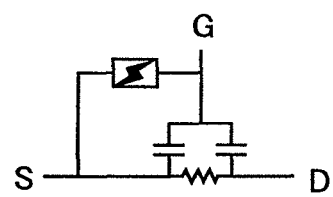
FIG. 10C is an equivalent circuit diagram for describing this invention.
Figure 11A:
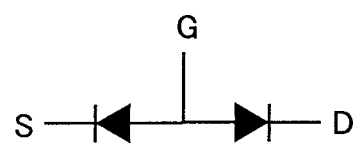
FIG. 11A is an equivalent circuit diagram for describing a related-art example.
Figure 11B:
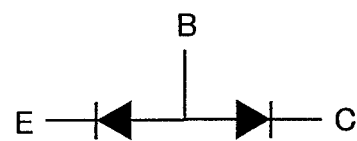
FIG. 11B is an equivalent circuit diagram for describing a related-art example.
Figure 11C:
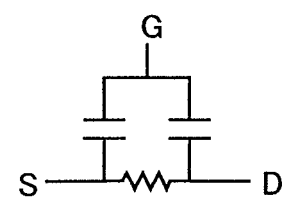
FIG. 11C is an equivalent circuit diagram for describing a related-art example.

Also as shown in FIG. 10C, a protecting element may be connected, for example, just between the gate and the source, that is, just between a single pair of terminals of the protected element.

In recent years, rapid advances have been made towards providing MOSFETs with finer, three-dimensional structures in order to attain high speeds with microprocessor LSIs and memory LSIs for PCs, and by significant reductions of the parasitic capacitance and parasitic resistance, it has become possible to provide MOSFETs with microwave characteristics that only GaAs devices could provide conventionally. MOSFETs have thus come to be used widely in power amps and RF-block MMICs for cellular phones, wireless broadband, and other microwave applications of the GHz band. Thus as with GaAs MESFETs, the gate length is reduced to the submicron order and the gate MOS capacitance is designed to be extremely small in order to secure good microwave characteristics. Due furthermore to the gate oxide film being made thin in order to achieve high speeds, MOSFETs were extremely weak against electrostatic breakdown and the finest care was necessary for handling. Furthermore, protecting diodes, which are widely employed for increasing the electrostatic breakdown voltage in general, consumer-use semiconductors for low frequency applications, such as audio, video, and power supply applications, have a PN junction and use thereof thus causes the parasitic capacitance to increase greatly by at least a few hundred fF or more. Such protecting diodes thus greatly degrade the microwave characteristics of a microwave MOSFET and therefore cannot be used.

However, since this invention's electrostatic breakdown protecting element does not have a PN junction and is of a capacitance of at the most a few dozen fF or less, it can greatly improve the electrostatic breakdown voltage without degrading the microwave characteristics of a microwave MOSFET.

This invention's protecting element is connected between two terminals of a protected element having a PN junction, Schottky junction, or capacitor to make electrostatic energy be discharged within the protecting element and thereby improve the electrostatic breakdown voltage of the protected element. This invention's protecting element can thus be applied not only to above-described examples but also to all semiconductor elements having a PN junction or Schottky junction. Also, the connection examples are simply examples and are defined only by the scope indicated by the claims.

With the above-described protected elements, the minimum electrostatic breakdown voltage between any two terminals of a protected element was conventionally 200V or less. However, by connecting this invention's protecting element, the electrostatic breakdown voltage between two terminals that is the minimum electrostatic breakdown voltage can be improved by 20V or more in comparison to prior to connection of the protecting element and thus be made more than 200V.

The shape and connection position of the protecting element 200 shall now be described further. Since it is considered that when static electricity is applied to the protecting element 200, an electrostatic current is generated, the protection effect can be improved by making a larger amount of electrostatic current flow through the protecting element 200. That is, the shape and connection position of the protecting element 200 should be designed making a larger amount of electrostatic current flow through the protecting element 200.

As described above, this embodiment's protecting element has a structure in which the first high concentration impurity region 201 and the second high concentration impurity region are disposed in opposing manner and the insulating region 203 is disposed at the periphery of both regions. The two regions are connected as two terminals to a protected element and electrostatic energy that is applied between the two terminals of the protected element is discharged between the first high concentration impurity region 201 and the second high concentration impurity region 202.

Figure 12:
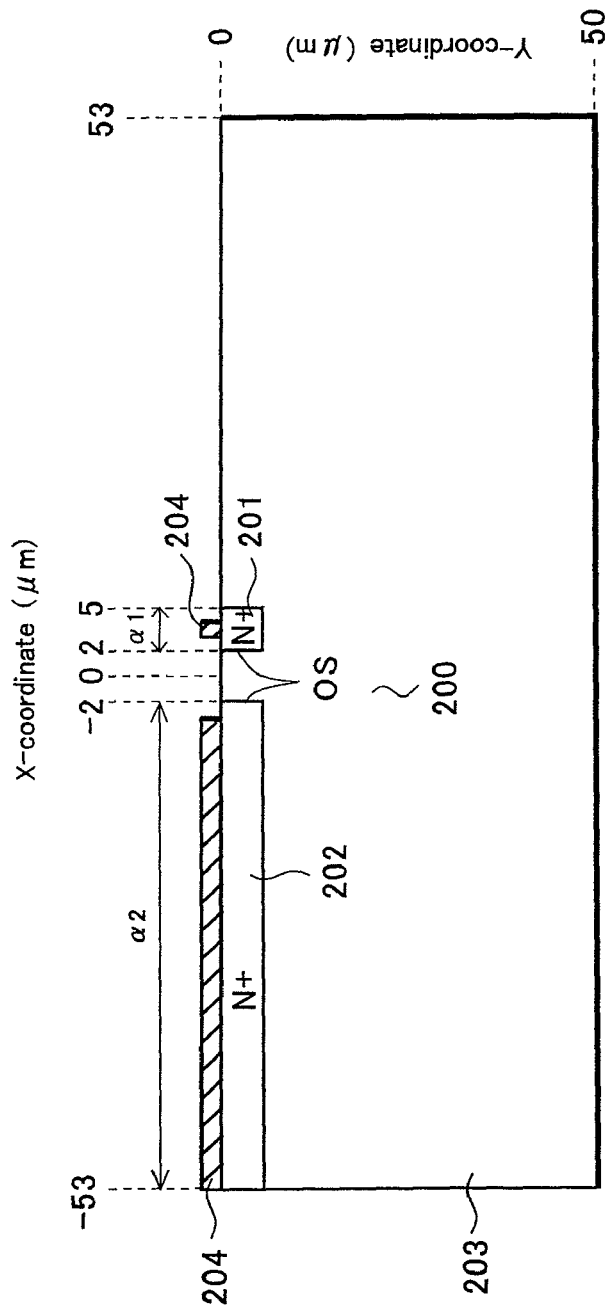
FIG. 12 is a cross-sectional model diagram of a device simulation of this invention.

As shown in FIG. 12, the first high concentration impurity region 201 has one side surface that opposes the second high concentration impurity region 202 and a side surface at the opposite side. Likewise, the second high concentration impurity region 202 also has one side surface that opposes the first high concentration impurity region 201 and a side surface at the opposite side. The side surface at the side at which the two regions oppose each other shall be referred to as the opposing surface OS.

Although an example in which the first high concentration impurity region is the first n$^+$-type region 201 and the second high concentration impurity region is the second n$^+$-type region 202 shall now be described, this embodiment's second high concentration impurity region 202 is not restricted to a single diffusion region. That is, all high concentration impurity regions, which are disposed so as to oppose the first high concentration impurity region 201 and is used for the discharge of electrostatic energy, are referred to inclusively. That is, as long as it is disposed so as to oppose a single first high concentration impurity region 201, the second high concentration impurity region 202 may be arranged from a single impurity diffusion region or may be a set of a plurality of partitioned impurity regions.

Also, in a case where the second high concentration impurity region 202 is partitioned into a plurality of types, the partitioned parts do not have to be directly continuous and may be discontinuous. That is, with the second high concentration impurity regions 202 that are connected to the same terminal of the same protected element 100 and are opposed to the first high concentration impurity region 201 in common, in a case where metal electrodes are disposed on the second high concentration impurity regions 202, differences may exist in the impurity concentration as long as adequately high impurity concentrations can be maintained with which the protecting element itself will not break down due to a depletion layer, resulting from a voltage due to static electricity, reaching a metal electrode. Also, even if such regions have differences in impurity concentration, differences in size, differences in shape, and several other types of differences, these shall be referred to inclusively as the second high concentration impurity region 202.

Likewise, the first high concentration impurity regions 201 that are connected to the same terminal of the same protected element 100 and are opposed to the second high concentration impurity region 202 in common shall be referred to inclusively as the first high concentration impurity region 201 even if there are such differences in impurity concentration, differences in size, differences in shape, and several other types of differences.

Also, although a part (203a) of a GaAs substrate shall be described as an example of the insulating region 203 below, an insulated region (203b), which has been insulated by ion implantation of an impurity into a substrate as described above, may be applied in the same manner.

FIG. 12 shows a cross-sectional model of a device simulation of the voltage-current characteristics of the protecting element 200 by an ISE TCAD (TCAD made by ISE Corp.). The protecting element 200 is formed by forming the first N$^+$ region 201 and the second N$^+$ region 202 by performing ion implantation into a 50 μm-thick GaAs semi-insulating substrate at a dose of 5×13 cm$^{-2}$ and an acceleration voltage of 90 KeV and then annealing. That is, with this structure, all of the area between the first n$^+$-type region 201 and the second n$^+$-type region 202 and the periphery of the two regions are the insulating region 203.

As shown in FIG. 12, with the first n$^+$ region 201, the width α1 in the direction of the separation of the opposing surfaces OS of the two regions is made approximately 5 μm or less and, more specifically, 3 μm. Although the narrower α1 is, the better, a width of 0.1 μM or more is necessary as a limit at which the arrangement will function as a protecting element. Also although with this embodiment, the first n$^+$-type region is disposed parallel to and is separated from the second n$^+$-type region 202 by approximately 4 μm, in planar pattern, the edge of the first n$^+$-type region may be made a pointed shape to facilitate discharge, in other words, the pattern may be one with which the distance with respect to the second n$^+$-type region 202 varies. The grounds for setting al to 5 μm or less shall be described later.

As shown in FIG. 12, the metal electrodes 204 are connected to the first n$^+$-type region 201 and the second n$^+$-type region 202. The methods illustrated in FIG. 2 and FIG. 3 may be considered as methods of connecting metal electrodes 204 to the first and second n$^+$-type regions.

The second n$^+$-type region 202 is, for example, a diffusion region disposed below a pad and its width thereat is made 51 μm. With each of the first and second n$^+$-type regions, the metal electrode 204 is disposed 1 μm to the inner side. The perspective depth, which is the device size (for example, the gate width in the case of an FET), is set to 1 μm.

Here, a simulation was performed in which the first $n^+$ region 201 is made the positive side, the second $n^+$ region 202 is made the negative side, and a current of 1 A is made to flow, assuming the application of an electrostatic voltage of 700V at 220 pF and 0Ω.

Figure 13:
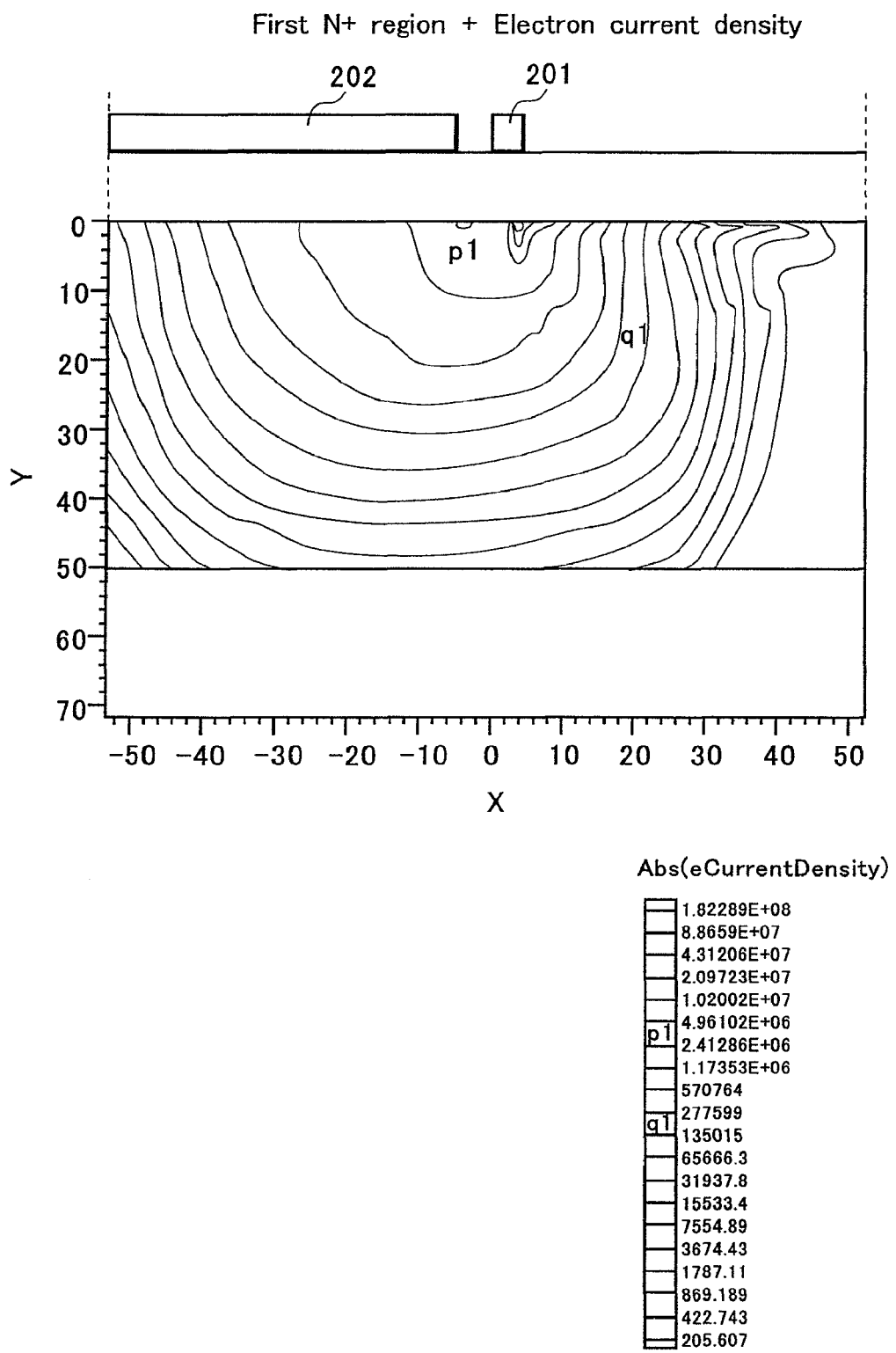
FIG. 13 is an electron current density distribution diagram of this invention.
Figure 14:
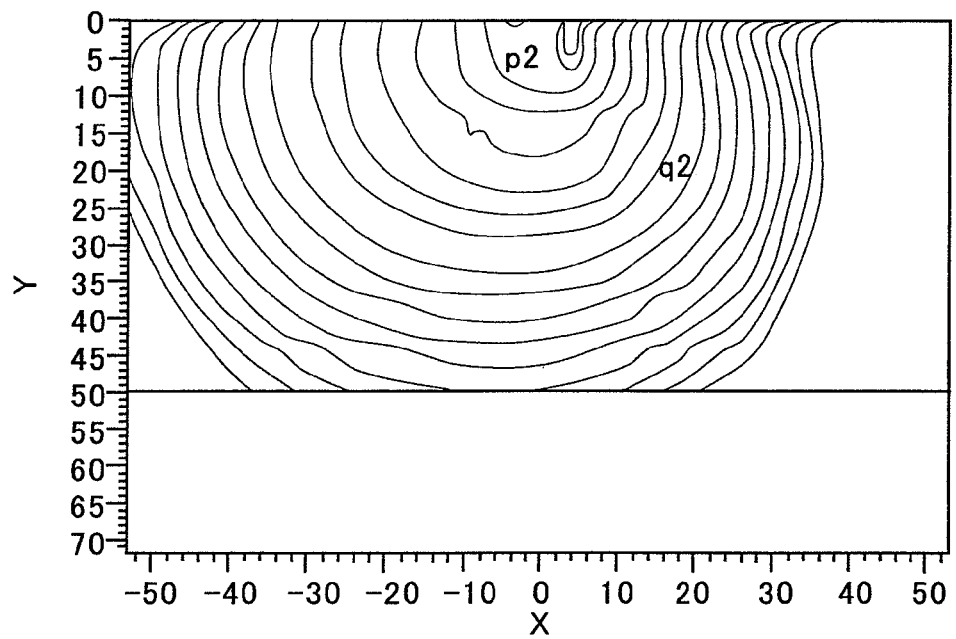
FIG. 14 is a hole current density distribution diagram of this invention.
Figure 14:
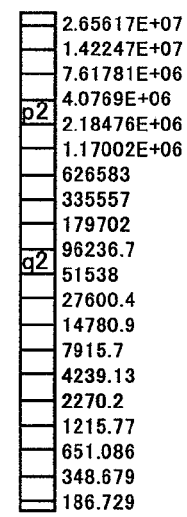
Figure 15:
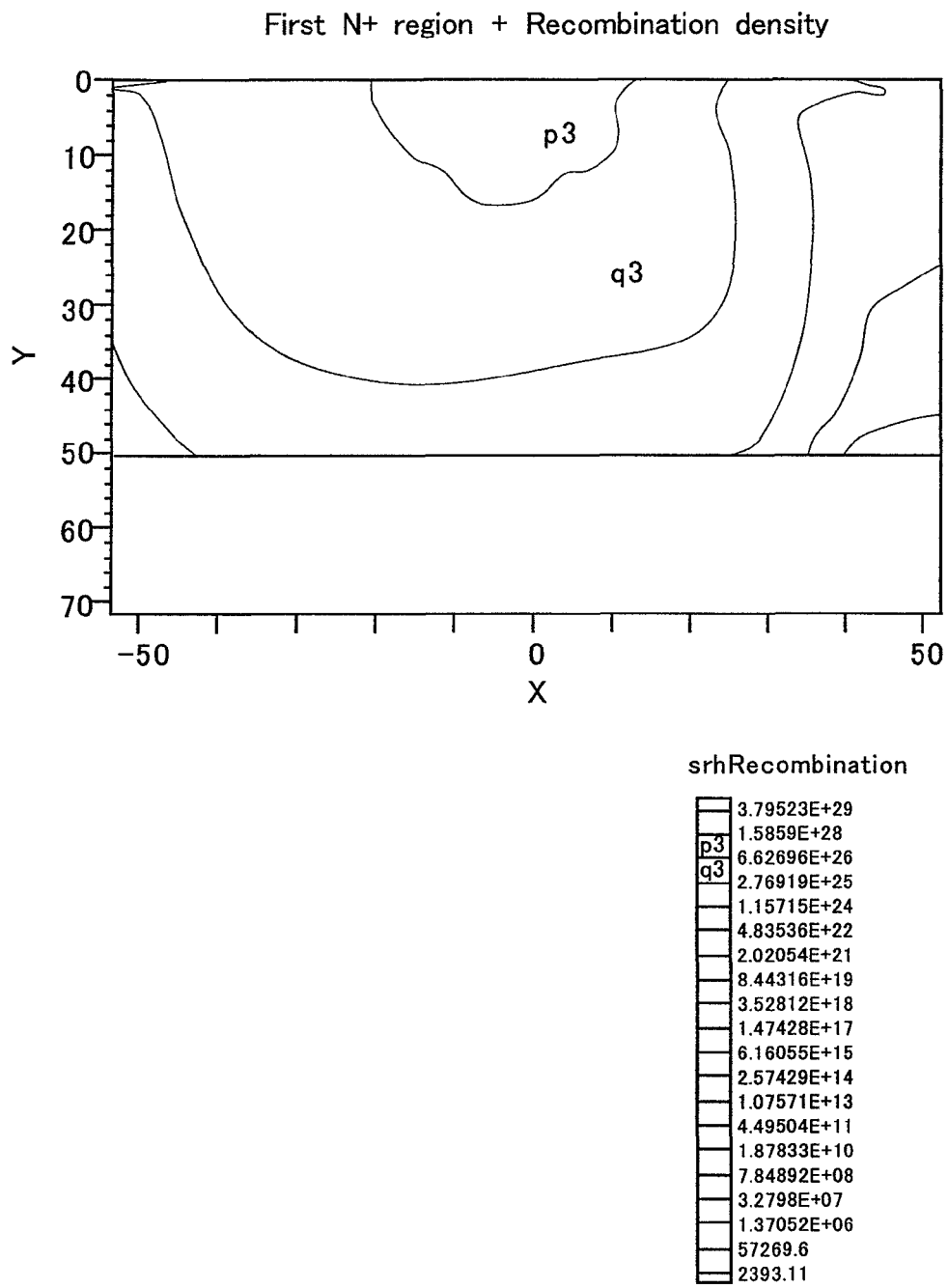
FIG. 15 is a recombination density distribution diagram of this invention.

FIG. 13, FIG. 14, and FIG. 15 respectively show the electron current density, hole current density, and recombination density distributions resulting from the simulation. In all cases, the values are indicated in units of $cm^{-3}$. In FIG. 13, the cross-sectional model illustrated in FIG. 12 is overlaid at the upper part. The situation is the same as in FIG. 14 and FIG. 15.

With the electron current density distribution of FIG. 13, the p1 region is the region of highest density among the regions that span both the first $n^+$-type region 201 and the second $n^+$-type region 202. Although the total current is the current resulting from summing the electron current and the hole current, since the electron current is by far greater than the hole current, the electron current is taken as representing the current, and with this embodiment, the part from the periphery of the first and second $n^+$-type regions or the substrate surface to the vicinity of a q1 region, at which the electron current density becomes approximately 10% that of p1, is defined as a current path of the protecting element 200. The reason why a current path is set to the vicinity of the q1 region is because a region at which the current density is less than that of q1 is considered as not affecting the operation.

As is clear from FIG. 13, due to the width of α1 being narrow, a large amount of current flows around the side surface at the side opposite from the opposing surface OS of the first $n^+$ region 201. It is considered that this wrap-around current will occur in likewise manner when static electricity is applied.

The q1 region at the outer side of the first $n^+$ region 201 is located at approximately 20 μm on the X-axis at a location furthest from the first $n^+$ region 201. The X-coordinate of the outer side end of the first $n^+$ region 201 is 5 μm as shown in FIG. 12 and at parts up to 15 μm at the outer side of the first $n^+$ region 201, flows approximately 10% or more of the electron current of the region of highest electron current density that spans across both the first $n^+$ region 201 and the second $n^+$ region 202.

The hole current shown in FIG. 14 likewise exhibits a wrap-around at the outer side of the first $n^+$ region 201. With this hole current density distribution, the hole current density of a q2 region near the X-coordinate of 20 μm is approximately 2% of the hole current density of the p2 region of the highest hole current density that spans across both the first $n^+$ region 201 and the second $n^+$ region 202.

The recombination shown in FIG. 15 likewise also exhibits a wrap-around at the outer side of the first $n^+$ region 201. With the recombination density distribution of FIG. 15, the recombination density of a q3 region near the X-coordinate of 20 μm is approximately 10% of the recombination density of the p3 region of the highest recombination density that spans across both the first $n^+$ region 201 and the second $n^+$ region 202.

Figure 16A:
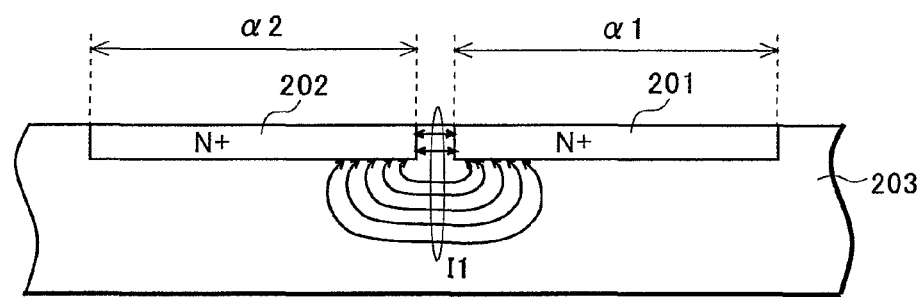
FIG. 16A is a schematic diagram of the current path of a a-structure.
Figure 16B:
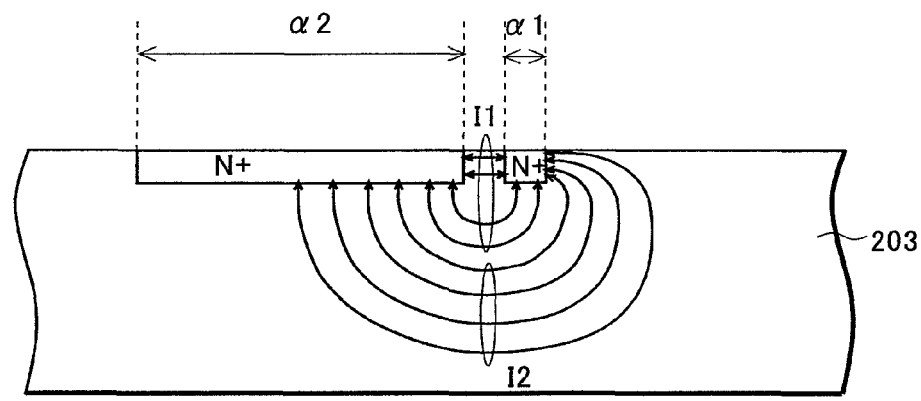
FIG. 16B is a schematic diagram of the current paths of a b-structure.

FIG. 16 show schematic diagrams of current paths formed in the insulating region 203 at the periphery of the first $n^+$-type region 201 and the second $n^+$-type region 202 based on the above-described distribution diagrams. For the sake of comparison, FIG. 16A shows a schematic diagram for a case where α1 and α2 are wide and have an equal width of approximately 51 μm (this shall be referred to hereinafter as "a-structure"). FIG. 16B illustrates the case where the first $n^+$-type region 201 is provided with an adequately narrow width in comparison to the second $n^+$-type region 202 as shown in FIG. 12 (α1<<α2; this shall be referred to hereinafter as "b-structure").

With the distribution diagrams on which FIG. 16A is based, the densities are distributed symmetrically since α1 and α2 are equal. For a-structure, the illustration of the distribution diagrams shall be omitted and only the schematic diagram is shown.

When the widths α1 and α2 are wide (50 μm) as in the case of FIG. 16A, a current path (from the p1 region to the vicinity of the q1 region) is formed between the opposing surfaces and near the bottom surface part as indicated by the arrows. With this specification, the path for the electron current and hole current, which is formed to a predetermined depth from the substrate surface and is formed between the opposing surfaces OS of the first $n^+$ region 201 and the second $n^+$-type region 202 and at the insulating region 203 between the vicinities of the bottom surfaces of the two regions as illustrated, shall be referred to as a first current path I1. That is, the first current path I1 is the only current path of a protecting element of a-structure.

Meanwhile, when, as shown in FIG. 16B, α1 is narrowed to approximately 5 μm, in addition to the first current path I1, which is formed between opposing surfaces OS and in the vicinities of the bottom surface parts, a path for the electron current and the hole current is formed at regions deeper than those of the first current path I1. This path wraps around first $N^+$ region 201, and with this path, the side wall at the outer side of the first $n^+$-type region at the side opposite opposing surface S is used for flow of the electron current and hole current and the q1 region is formed at a lower location in comparison to a-structure.

With this specification, the path for the electron current and the hole current, which is formed at regions deeper than those of the first current path I1 and is formed at an insulating region from the second $n^+$-type region 202 to the side surface at the side opposite from the opposing surface OS of the first $n^+$-type region 201 as illustrated, shall be referred to as a second current path I2.

With the second current path I2 in FIG. 16B, since the width of the second $n^+$-type region 202 is 50 μm and thus adequately wide, the current path is formed in the horizontal direction at wider bottom surface part near the second $n^+$-type region 202 than the case of the current path near the bottom of the second n+-type region at a-structure.

Meanwhile with the first $n^+$-type region 201, since the width α1 is narrow and approximately 5 μm as mentioned above, the current flows so as to wrap around the first $n^+$-type region 201 and not only the bottom surface part of the first $n^+$-type region 201 but also the side surface at the side opposite from the opposing surface OS also becomes a part of the current path.

Thus as is clear from the above-described drawings, whereas in the case of a-structure, only the first current path I1 is the current path of the protecting element, with the protecting element 200 of b-structure, the second current path I2 is formed due to the narrow first $n^+$ region 201 and thus the two current paths of the first current path I1 and the second current path I2 are formed.

With the second current path I2, the current flows in and out from the side surface at the outer side of the first $n^+$ region 201. Also in comparison to the first current path I1, the second current path I2 passes through regions deeper than the first and second $n^+$-type regions and by reaching the first $n^+$-type region 201 in a detouring (roundabout) manner, provides a long path inside the insulating region 203. Traps (EL2, in the case of GaAs) inside the insulating region 203 can thus be used to increase the opportunity for a conductivity modulation effect.

That is, with b-structure, by the provision of the second current path I2, the conductivity modulation efficiency is improved in comparison to a case where only the first current path I1 is provided and the flowing of a larger amount of current is enabled. The current value that flows between the first and second $n^+$-type regions is increased, whereby a larger amount of electrostatic current can be made to flow when static electricity is applied and the effect as a protecting element is increased.

The method of improving the conductivity modulation efficiency by intentionally detouring the current path over a long distance to increase the chances that main carriers will encounter the carriers of the opposite polarity is frequently employed in IGBTs and other conductivity modulation devices and shall be described in detail below.

Generally, what makes an insulating region an insulating region is the existence of traps. As an inherent property, a donor trap has a positive charge, becomes neutral upon capturing an electron, and can become a medium for conductivity modulation. In the case of GaAs, EL2 is the donor trap. Traps also exist in an insulated region (203b) formed by impurity implantation.

Figure 17:
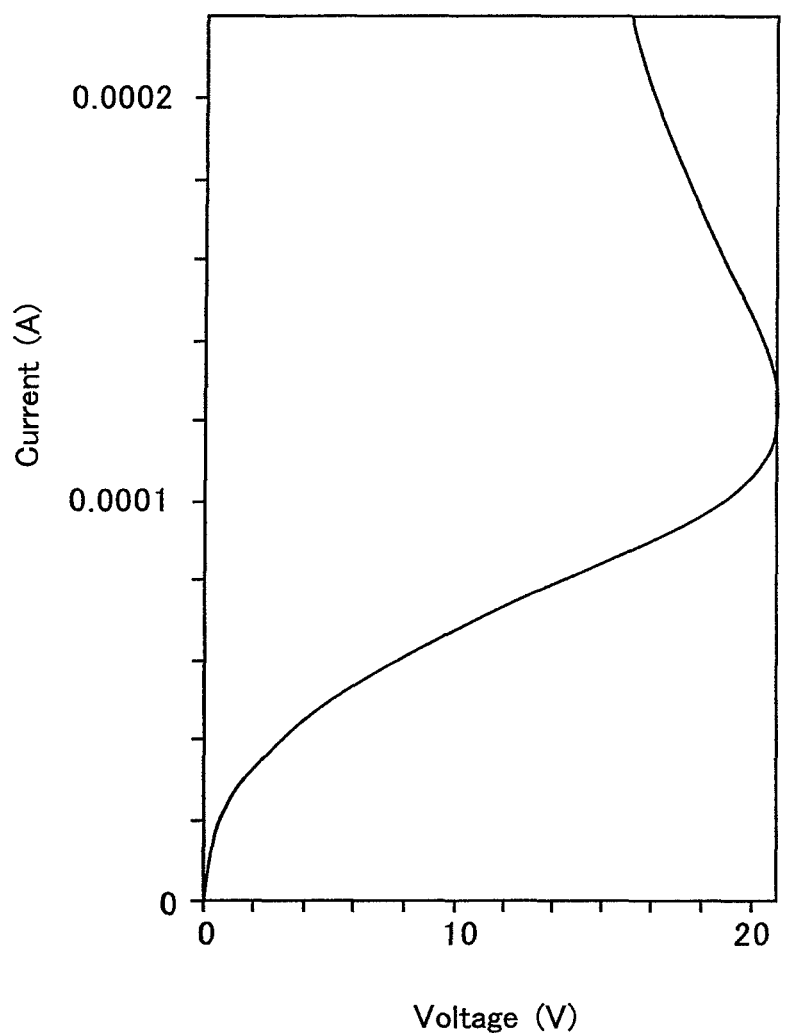
FIG. 17 is a current-voltage characteristics diagram of this invention.

FIG. 17 shows the results of simulating the voltage-current characteristics at a perspective depth of 1 μm when with a device of the structure shown in FIG. 12, the first $n^+$-type region 201 is made the positive side and the voltage applied between the first $n^+$-type region 201 and the second $n^+$-type region 202 is increased. As illustrated in this figure, the breakdown voltage is 20 to 30V.

The protecting element 200 thus breaks down at 20 to 30V and when a greater voltage is applied, it undergoes bipolar operation and conductivity modulation occurs. Since a protecting element is used by making it break down when an electrostatic voltage of several hundred V is applied, conductivity modulation occurs from the initial stage of the operating state of the protecting element 200.

As this conductivity modulation occurs more frequently, since the avalanche multiplication following breakdown becomes intense and electron-hole generation and recombination occur more actively, more current flows.

Thus by the forming of the second current path I2 in the protecting element 200, the conductivity modulation efficiency at deep regions and in the outward direction of the first $n^+$-type region 201 at the side opposite from the opposing surface OS can be improved.

Also since the width of the first $n^+$-type region 201 is narrowed to 5 μm or less in order to provide the second current path I2, in the first current path I1, the electrons in the vicinity of the first $n^+$-type region become crowded and repel each other to cause electrons, which are the major carriers, to pass through paths that are deeper and wider in comparison to a-structure, and thus the current path I1 itself is more subject to conductivity modulation correspondingly.

Figure 18:
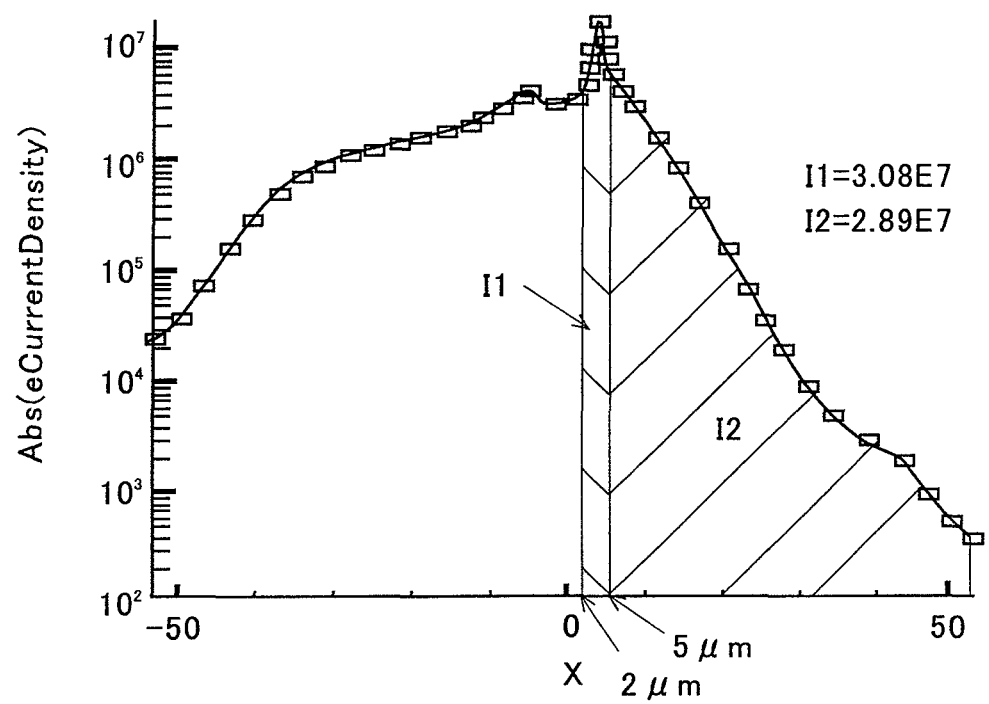
FIG. 18 shows the simulation results of this invention.

The graph of FIG. 18 is used to determine the proportion of the current value of the second current path I2 with respect to the total current value of b-structure. This is a graph of the X-coordinate dependency of the electron current density at a depth of 2 μm from the surface that results from a simulation in which the first $n^+$ region 201 is made the positive side and a current of 1 A is made to flow at a perspective depth of 1 μm, assuming the application of an electrostatic voltage of approximately 700V at 220 pF and 0Ω.

For the electron current density at a depth of 2 μm from the surface, the electron current density immediately below the first $n^+$-type region 201 is integrated along the width in the X-direction of the first $n^+$-type region 201 to determine the value corresponding to the first current path I1, the electron current density at the outer part with respect to the first $n^+$-type region 201 is integrated along the width in the X-direction of the outer part to determine the value corresponding to the second current path I2, and the proportion of the current value of the second current path I2 is calculated.

As a result, the current value of the second current path I2 was found to be of a proportion of 0.48 (2.89/(3.08+2.89)) with respect to the total current value and thus of a current value of the same level of that of the first current path I1.

Furthermore, as shall be described later, in the case of b-structure, the first current path I1 itself exhibits a larger current value than the first current path I1 in the case of a-structure. Thus with b-structure, since the second current path I2 itself is of the same level as the first current path I1, in total, a far greater amount of current flows in comparison to a-structure.

Since as a secondary effect, the first current path I1 and the second current path I2 combine as described above to significantly enlarge the current path in comparison to a-structure, the temperature inside the crystal becomes lower than that of the related art, the mobilities of electrons and holes increase correspondingly, and thus a correspondingly larger amount of current can be made to flow.

Since the current value of the protecting element 200 as a whole thus increases, the protection effect increases.

FIG. 19 show a table in which the spreading of the electron current, hole current, and recombination density are compared. Here, simulations were carried out for a-structure and b-structure and the resulting values of the same type of density distributions as those shown in FIG. 13 through FIG. 15 are compared under fixed conditions.

Figures 19A, 19B, 19C:
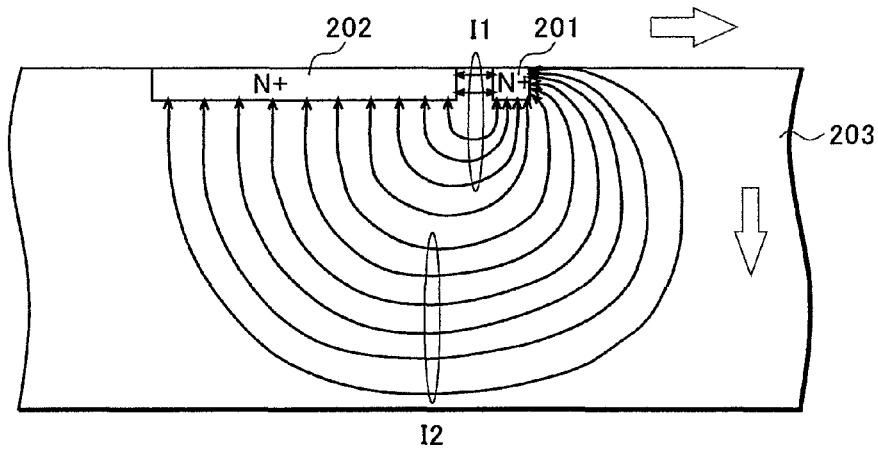
FIG. 19A shows the simulation results of this invention.
FIG. 19B shows the simulation results of this invention.
FIG. 19C is a schematic diagram of the current paths of b-structure.

In FIG. 19A, "y_2" is the numerical value in units of μm of the width in the X-direction of a section, obtained in the corresponding density distribution diagram by cutting in the horizontal direction at a depth of 2 μm from the surface, at which the corresponding density becomes $10^5$ cm$^{-3}$.

"X_0" is the numerical value in units of μm of the depth from the surface at which the corresponding density becomes $10^5$ cm$^{-3}$ in the Y-direction section at X=0 μm in the coordinate system shown in FIG. 12.

"Product" is the value obtained by multiplying the value of y_2 by the value of X_0 and is a value for comparing, in a simulating manner, the area of the figure formed when the points at which the corresponding density becomes $10^5$ cm$^{-3}$ are traced and joined together. That is, "product" is an index that expresses the respective spreading of electrons, holes, and recombinations.

Also in the table, "a-structure" is an a-structure with which both the first $n^+$ region 201 and the second $n^+$ region 202 have a width of 51 μm (=α1=α2), the second $n^+$ region 202 is made the positive side, the first $n^+$ region is made the negative side, and the perspective depth is made 1 μm, and the values for this structure are the calculation results for a case where 0.174 A is made to flow.

"b-structure-1" is a b-structure with which the width α1 of the first $n^+$ region 201 is set to 3 μm, the width α2 of the second $n^+$ region 202 is set to 51 μm, the second $n^+$ region 202 is made the positive side, and the first $n^+$ region is made the negative side, and the values for this structure are the calculation results for a case where 0.174 A is made to flow at a perspective depth of 1 μm.

"b-structure-2" is a b-structure with which the applied polarity is reversed with respect to that of b-structure-1, that is, with which the width α1 of the first $n^+$ region 201 is set to 3 µm, the width α2 of the second n⁺ region 202 is set to 51 µm, the first n⁺ region is made the positive side, and the second n⁺ region is made the negative side, and the values for this structure are the calculation results for a case where 0.174 A is made to flow at a perspective depth of 1 µm.

For all three of the abovementioned densities, the product values of both b-structure-1 and b-structure-2 are greater than those of a-structure.

This indicates that regardless of polarity, that is, regardless of whether the first n⁺ region 201 side is positive or the second n⁺ region 202 side is positive, the electron current, hole current, and recombination are all distributed over a wider range with b-structure than with a-structure and thus that the conductivity modulation efficiency is higher with b-structure than with a-structure. Furthermore, that the current flows across a wider range indicates that the temperature drops, thus indicating that the mobilities increase correspondingly and the current increases further.

The calculation results for the case where 1 A is made to flow through a b-structure-3, which is a b-structure with which the first n⁺ region 201 is made the positive side, are shown in FIG. 19B. Whereas a comparison was made for a unified current of 0.174 A from the standpoint of calculation ability in the three calculations of FIG. 19A, with actual static electricity the current at a perspective depth of 1 µm is approximately 1 A for conditions of a 700V electrostatic voltage, 220 pF, and 0Ω. The results are shown here since calculation by simulation for 1 A was possible only for the case where the first n⁺ region 201 is made the positive side.

In comparison to b-structure-2 of FIG. 19A, with b-structure-3, even though the polarity is the same, the values of the respective products are increased by one order of magnitude or more when the current is increased from 0.174 A to 1 A.

Thus as shown in FIG. 19C, if in a case where a higher electrostatic voltage is applied to the protecting element 200 and more electrostatic current flows than the current shown in FIG. 13 and FIG. 16B, which is a schematic diagram of FIG. 13, the insulating region 203 is adequately large, the q1 region (region of a current density of approximately 10% or more of the region of highest density) shown in FIG. 13 spreads further downwards and in the outer direction at the side opposite opposing surface OS, that is, the second current path I2 spreads. Since the more the second current path I2 spreads, the further the conductivity modulation efficiency can be increased, the more current flows, and the further the region surrounded by q1 region spreads downwards, the second current path I2 spreads even further. Since the crystal temperature of the substrate is thus lowered, the carrier mobilities can be increased further, more current can be made to flow, and the protection effect can be improved further.

Thus with b-structure, the higher is the electrostatic voltage that is applied, the higher the conductivity modulation efficiency becomes and the more the current path spreads, that is, the conductivity modulation effect can be adjusted automatically.

Also, with the first current path I1, the higher the electrostatic voltage is, the deeper the current flows, and thus as with the second current path I2, the conductivity modulation effect can be adjusted automatically.

Thus, although details shall be given later, by securing an adequate area of the insulating region 203 that can become the second current path I2, a structure is provided with which a protected element can be protected from damage even from static electricity of 2500V at 220 pF and 0Ω. Moreover, since there is hardly any parasitic capacitance, the high-frequency characteristics will not be degraded. That is, by connecting the protecting element having a parasitic capacitance of 20 fF to an element which by itself has an electrostatic breakdown voltage of only approximately 100V, the electrostatic breakdown voltage can be improved by 20 times or more.

The reason why a value of 5 µm or less is preferable for α1 of b-structure shall now be described using FIG. 20. With FIG. 20, the electron current densities in b-structure-2 in FIG. 19 are calculated while varying the width α1 of first N⁺ region 201.

When the width α1 of the first n⁺ region 201 is made 5 µm or less, the proportion of the second current path I2 increases suddenly. That is, since the current spreads in the horizontal direction and the depth direction, the conductivity modulation efficiency increases correspondingly and the temperature drops, thereby increasing the carrier mobility, and thus the current value increases significantly and the protection effect of the protecting element increases greatly.

Figure 20:
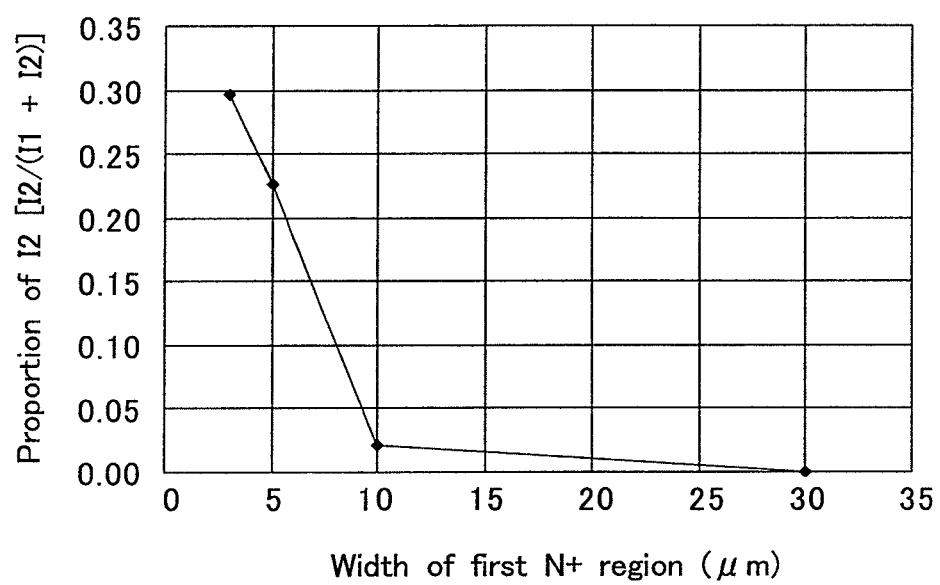
FIG. 20 shows the simulation results of this invention.

Here, whereas the proportion of the second current I2 was 0.48 for the case of α1=3 µm shown in FIG. 18, the I2 proportion for the point corresponding to a first n⁺ region width of 3 µm for the same positive the first n⁺ region is only 0.3 in the abovementioned FIG. 20 because FIG. 20 shows values for 0.174 while FIG. 18 shows values for 1 A, and it can be understood that up until a certain fixed current value, the greater the current is, the greater is the proportion of the second current path I2. Furthermore, although a comparison was made with 0.174 A due to the limits of the calculation capacity for simulating a large device, as long as a relative comparison is being made, an adequate comparison can be made with this current value.

The width β of the insulating region 203 that should be secured at the outer side of the first n⁺-type region 201 shall now be described. As mentioned above, with the second current path I2, since the second current path I2 spreads to the insulating region 203 at the side opposite from the opposing surface OS of the first n⁺-type region 201, the insulating region 203 of an adequate width β is preferably secured at this side.

Figure 21A:
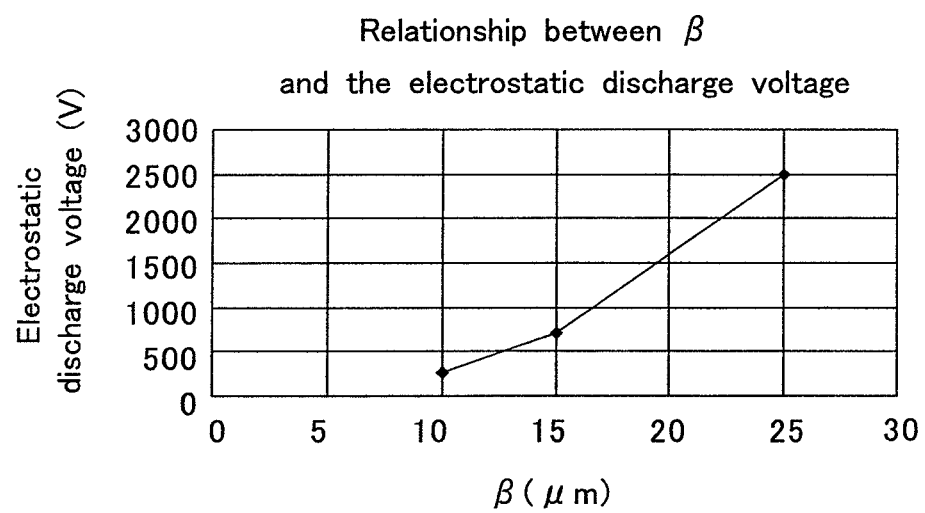
FIG. 21A shows measurement results of this invention.

The β of a b-structure and the electrostatic breakdown voltage shall now be described with reference to FIG. 21. As mentioned above, securing an adequate area of the insulating region 203 is equivalent to securing an adequate region that can become the second current path I2 and thus provides a high protection effect. That is, a predetermined insulating region width β is secured at the side opposite from the opposing surface OS as shown in the plan view of FIG. 21B. FIG. 21A shows the results of the experiment to measure the electrostatic breakdown voltage upon varying the value of β.

The protected element 100 used for measurements is an element in which a resistor of 10KΩ is connected in series to the gate of a GaAs MESFET with gate length of 0.5 µm and gate width of 600 µm. Prior to connection of the protecting element 200, the electrostatic breakdown voltage between the source or drain electrode and the resistor end (gate electrode) is approximately 100V. The electrostatic breakdown voltages are then measured upon connecting the respective ends of the first n⁺-type region 201 and the second n⁺-type region 202 of the protecting element 200 of b-structure in parallel between the source or drain electrode and the resistor end (gate electrode) and varying the value of β. The capacitance between the first n⁺-type region 201 and the second n⁺-type region 202 is 20 fF.

Figure 21B:
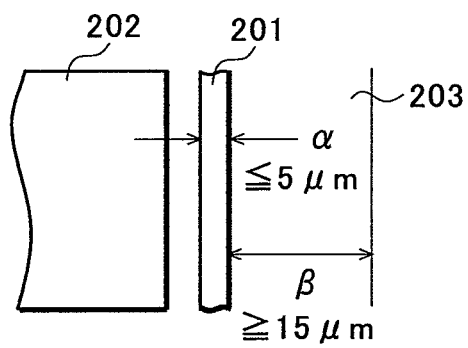
FIG. 21B is a schematic plan view of this invention.

As shown in FIG. 21B, when β is increased to 25 µm, the electrostatic breakdown voltage is improved to 2500V. The electrostatic breakdown voltage when the β shown in FIG. 21A is 15 µm is 700V. This means that when the electrostatic voltage is increased from 700V to 2500V, the second current path I2 extends by 15 μm or more in the outer direction (β) at the side opposite opposing surface OS of the first n$^+$-type region 201.

That the electrostatic voltage increases means that second current path I2 spreads correspondingly. In other words, although the spreading of the second current path I2 will be restricted if an adequate area of the insulating region 203 is not secured, by securing an adequate area of the insulating region 203, the second current path I2 can be spread adequately.

Thus with b-structure, by securing a width β of 10 μm or more and preferably 15 μm or more for the insulating region 203 at the outer side of the first n$^+$-type region 201, the second current path I2 can be spread further to increase the conductivity modulation efficiency further.

Although with a-structure, the electrostatic breakdown voltage could only be increased by two to three times when a protecting element is connected, for b-structure, it has been confirmed that an electrostatic voltage of 700V is realized if β is 15 μm, and by extending β to 25 μm, the electrostatic voltage can be increased by 2500V, in other words, by 25 times. Thus with b-structure, by securing a predetermined β, a current of at least approximately 10 times as large as that which can be made to flow through a conventional protecting element can be made to flow through.

As mentioned above, the current that flows through the first current path I1 and the current that flows through the second current path I2 are nearly equivalent and thus that a current of at least 10 times as large as that which can be made to flow through a conventional protecting element can be made to flow through can be understood as meaning that for both the first current path I1 and the second current path I2, the current that flows through each current path is respectively at least 5 times as large as that which can be made to flow through a related-art protection circuit.

It is thus preferable for β to be 10 μm or more, and this means that in the integrating a protecting element 200 in a chip, other components, wiring, etc., should be positioned upon securing an the insulating region 203 with the width 13 at the outer side of the first n$^+$-type region 201.

Figure 22A:
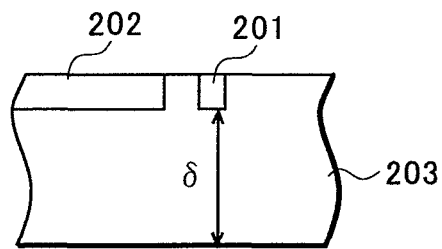
FIG. 22A is a schematic sectional view of this invention.

Likewise as shown in FIG. 22, in order to secure the second current path I2, it is preferable to secure an adequate area of insulating region in the depth direction as well. FIG. 22A is a sectional view, and here, the insulating region 203 of a predetermined depth δ is secured below the first n$^+$-type region 201 and the second n$^+$-type region 202.

Figure 22B:
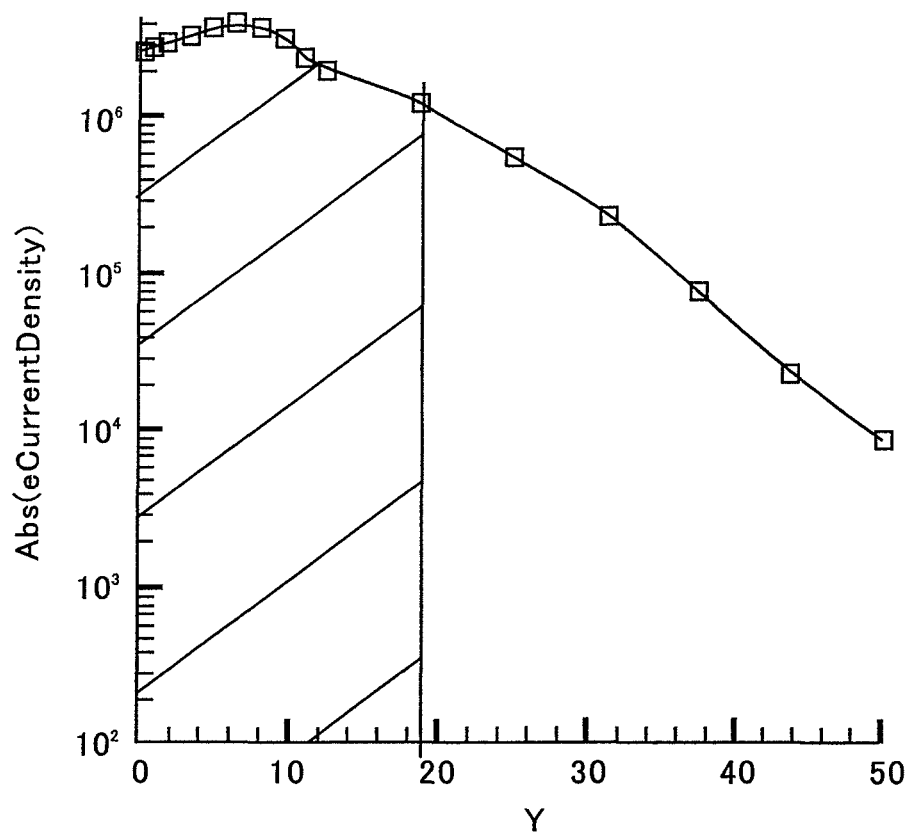
FIG. 22B shows the simulation results of this invention.

FIG. 22B shows a graph of the electron current density along the Y-direction section at coordinate X=0 μm when a simulation is performed in which the first n$^+$-type region 201 is made the positive side and 1 A is made to flow at a perspective depth of 1 μm in assumption of the application of an electrostatic voltage of 700V at 220 pF and 0Ω. When the electron current density is integrated along the depth direction from the surface of this graph, the integral (hatched part) up to a depth (Y) of 19 μm was found to be 90% of the integral up to the total depth of 50 μm. The depth δ of insulating region 203 is thus preferably 20 μm or more.

Although the sizes (β and δ) of the insulating region 203 and width (α1) of the first n$^+$-type region 201 that should be secured at the periphery of the protecting element 200 were described above, depending on the position on a chip, it may not be possible to secure an adequate β or δ or an adequate distance of opposing surfaces OS.

Figure 23A:
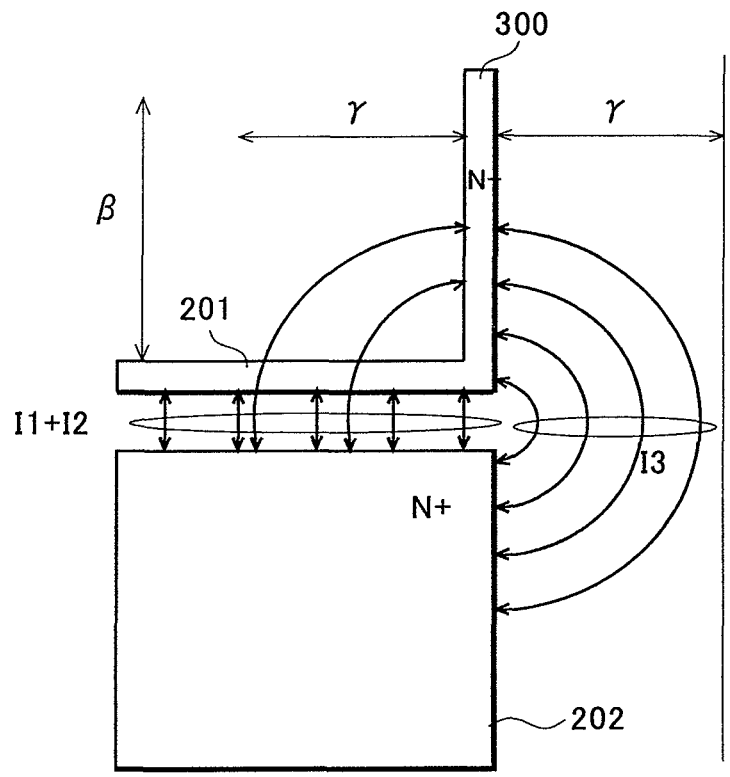
FIG. 23A is a schematic plan view of this invention.

Thus in such a case, as shown in the plan view of FIG. 23, the first n$^+$-type region 201 may be bent in an separating direction from opposing surfaces OS, thereby forming an extension part 300, and a predetermined insulating region γ may be secured in the direction of extension of opposing surfaces OS to form a third current path I3, which is to be an electron current and hole current path of high conductivity modulation efficiency, in the insulating region 203 between the extension part 300 and the second n$^+$-type region.

With the third current path I3, a larger current path can be secured in the direction of extension of opposing surfaces OS (separating direction from a plane orthogonal to opposing surfaces OS), that is, in the outer direction of extension part 300 and the second n$^+$-type region 202. Although only a planar representation is provided by the figure, since the third current path I3 is also formed in direction perpendicular to the paper surface (direction of the depth of the device), the current in the depth direction increases as well. In the depth direction (direction perpendicular to the paper surface) of opposing surfaces OS, the first current path I1 and the second current path I2 are formed and thus the first, second, and third current paths I1 to I3 become the current paths of the protecting elements.

Figure 23B:
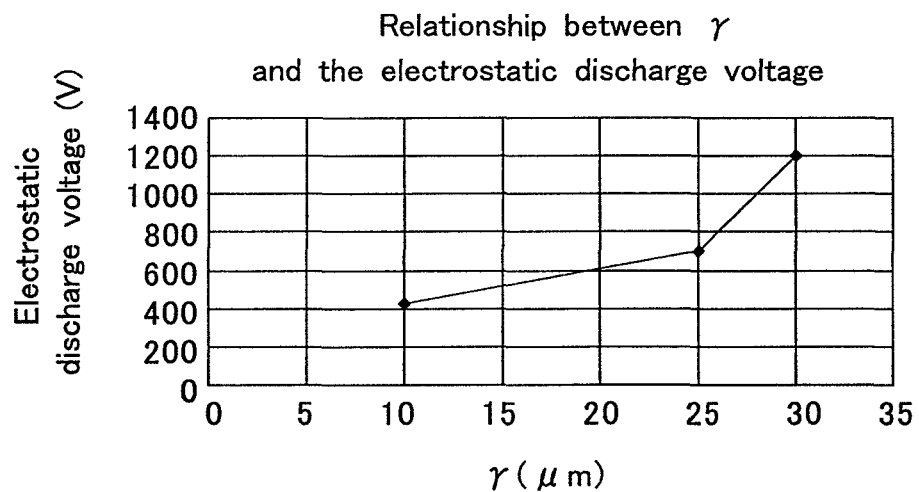
FIG. 23B shows the measurement results of this invention.

In FIG. 23B, actually measured values are shown for comparison of y and the electrostatic breakdown voltage. The protected element 100 and the protecting element 200 are connected by the same method as that employed for FIG. 21, with which the electrostatic voltage was measured while varying the value of β.

As shown in FIG. 23B, when γ is increased to 30 μm, the electrostatic breakdown voltage is improved to 1200V. When γ is 25 μm, the electrostatic breakdown voltage is 700V. This means that when the electrostatic breakdown voltage is increased from 700V to 1200V, the third current path I3 extends by 25 μm or more in the abovementioned insulating region between the extension part 300 and the second n$^+$-type region.

Thus even in the case where the extension part 300 is provided, the current path I3 can be spread further and the conductivity modulation efficiency can be increased further, when the higher the electrostatic voltage becomes. In other words, the conductivity modulation effect can be adjusted automatically according to the voltage of the applied static electricity. Since the temperature of the insulating region is thereby lowered and the carrier mobilities can be increased further, more current is made to flow, and the protection effect is improved.

In other words, an adequate area of the insulating region 203 is preferably secured at the periphery of the extension part 300 as well and by securing an adequate y, a space in which the third current path I3 can spread adequately can be secured to make more electrostatic current flow in correspondence to the electrostatic voltage. Thus the width γ is preferably 10 μm or more and more preferably 20 μm or more. Although in FIG. 23A, γ is secured at the outer side (right side of the figure) of the extension part 300, the effect can be improved by securing γ at the inner side (left side of the figure) in a symmetric manner centered about the extension part 300 as well, in other words, by securing γ at the sides of both side surfaces of the extension part 300.

Although it is optimal to secure γ upon securing β, even if β is inadequate, the effect of the protecting element is improved by securing γ.

Figure 24:
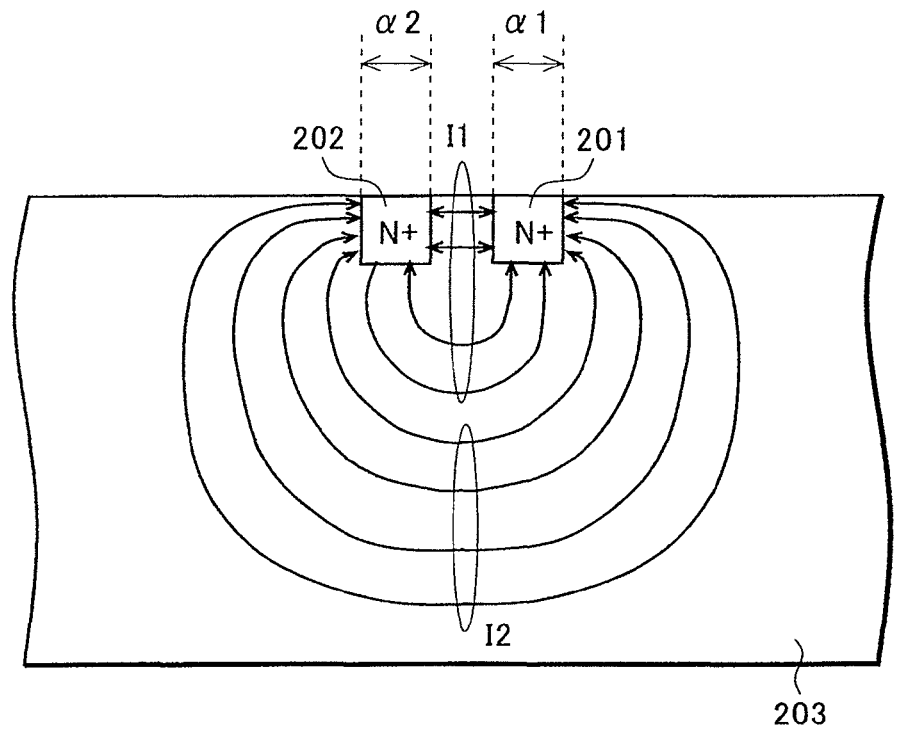
FIG. 24 is a schematic diagram of the current paths of a c-structure.

FIG. 24 shows a schematic diagram of current paths in a case where both the first n$^+$-type region 201 and the second n$^+$-type region 202 have a width of 5 μm or less (this structure shall be referred to as "c-structure").

C-structure is a structure in which the width α2 of the second n$^+$-type region 202 of b-structure is narrowed so as to be equal to α1 of the first n$^+$-type region, and these regions are disposed in opposing manner at a mutual distance of approximately 4 μm and have the insulating region 203 disposed at the periphery. The first current path I1 and the second current path I2 are formed with c-structure as well.

The first current path I1 is formed from the substrate surface to the parts between opposing surfaces OS of the first and second n⁺-type regions and in the insulating region 203 between the vicinities of the bottom surfaces of the two n⁺-type regions and is a path for the electron current and the hole current.

The second current path I2 is formed so as to detour through regions that are adequately deeper than the first and second n⁺-type regions and reach the side surfaces of the two regions at the sides opposite opposing surfaces OS. That is, for both the first n⁺-type region 201 and second n⁺-type region 202, the side surfaces at the sides opposite from the opposing surfaces OS can be used for the current path and the second current path I2 is formed in regions deeper than the first current path I1.

Figure 25:
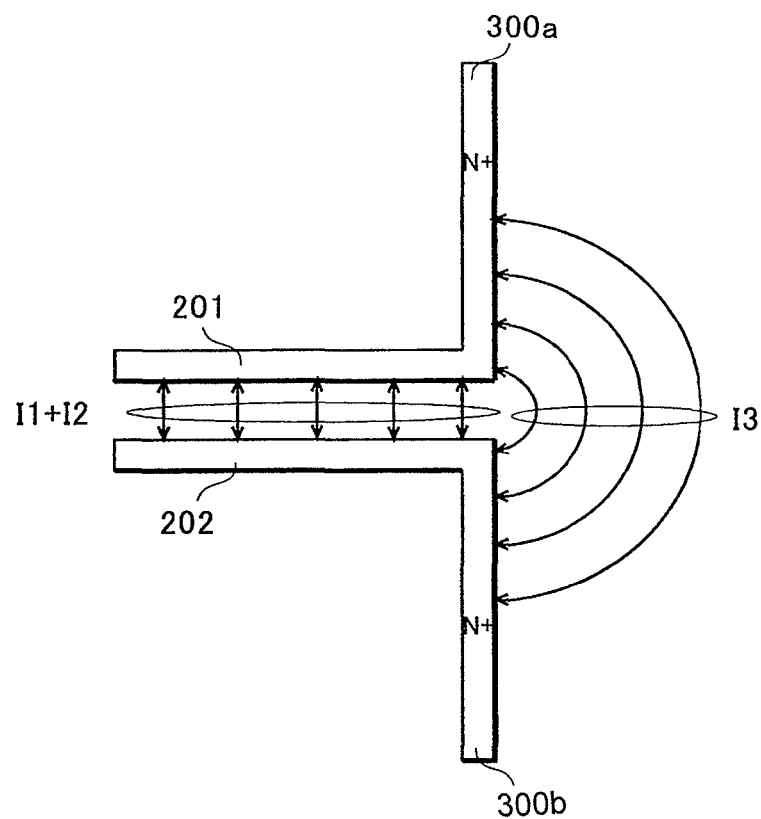
FIG. 25 is a schematic plan view of this invention.

Furthermore as shown in FIG. 25, the first n⁺-type region 201 may be provided with an extension part 300a that is bent in an separating direction from opposing surfaces OS to form the third current path I3 that is to be a path for the electron current and the hole current that increases conductivity modulation in the insulating region between the extension part 300a and the second n⁺-type region 202.

Likewise, the second n⁺-type region 202 may be provided with an extension part 300b that is bent in an alienating direction from opposing surfaces OS to form the third current path I3 that is to be a path for the electron current and the hole current that increases conductivity modulation in the insulating region between the extension part 300b and the first n⁺-type region 201.

Just one of either of the extension parts 300a and 300b may be provided or both of the n⁺-type regions may be provided with extension parts. Since the current path I3 is thereby formed as shown in FIG. 25, the current value increases and the protection effect increases.

As values of β, γ, and δ, the abovementioned values are favorable, and although values less than or equal to the abovementioned values will still enable the securing of current paths that are greater in comparison to those of a-structure, it is preferable to provide a pattern that can secure the respective values described above as much as possible.

That is, an adequate space (β, γ) is preferably secured in insulating region 203 at the periphery of the first n⁺-type region 201 (in the case of c-structure, of the second n⁺-type region 202 as well) that makes up the protecting element 200 so as not to obstruct the second current path I2 or the third current path I3, and the protected element 100 to which the protecting element 200 is connected and other components and wiring, etc., are preferably disposed at the outer side of the first n⁺-type region 201 at a distance of approximately 10 μm or more. Also, since insufficient area of chip end parts can also obstruct a current path, in the case of a pattern in which the first n⁺-type region 201 is positioned at a chip end part, approximately 10 μm or more is preferably secured as the distance to the chip end as well.

FIG. 26 shows an example where the protected element 100 and the protecting element 200 are integrated in a chip.

FIG. 26 shows an example of the chip pattern of a GaAs MESFET. An FET is disposed on a GaAs substrate and a resistor R is connected to the gate electrode 106 of the FET. At the surroundings of the FET are respectively disposed the source electrode pad SP, drain electrode pad DP, and gate electrode pad GP, which is disposed at the other end of the resistor R.

Here, as an isolating measure for preventing the leakage of high-frequency signals from the respective pads, pad n⁺ regions 350 are disposed below and at the peripheries of the respective pads. A gate metal layer 320, which is the lowermost layer of each pad, forms a Schottky junction with the GaAs semi-insulating substrate and each pad n⁺ region 350 forms a Schottky junction with the corresponding pad.

Figure 26A:
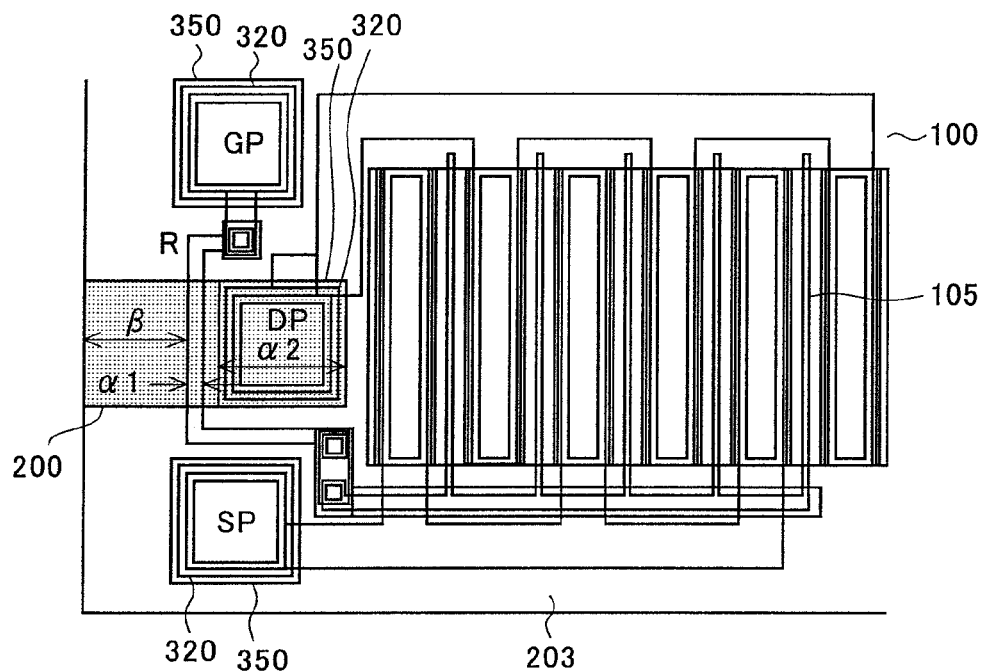
FIG. 26A is a plan view for describing this invention.

That is, with the arrangement of FIG. 26A, the resistor R is disposed adjacent the drain electrode pad DP so that the distance, between an n⁺-type region that makes up the resistor R and the pad n⁺-type region 350 adjacent it, will be 4 μm, and the insulating region 203 is disposed at the periphery to compose the protecting element 200. A part of the resistor R is the first n⁺-type region 201 and a part of the pad n⁺-type region 350 below and at the periphery of the drain electrode pad DP is the second n⁺-type region 202. The protecting element 200 is thus connected in parallel between the gate and drain terminals of the FET. With this pattern, the width of the resistor R is α1 and is made 5 μm or less. Also, the other components are disposed upon securing 10 μm or more as the width β of the insulating region 203 at the outer side of the resistor R that is to be the first n⁺-type region 201. In the case of this pattern, the chip edge is an edge of β and 10 μm or more is secured as the distance 13 from resistor R to the chip edge.

Figure 26B:
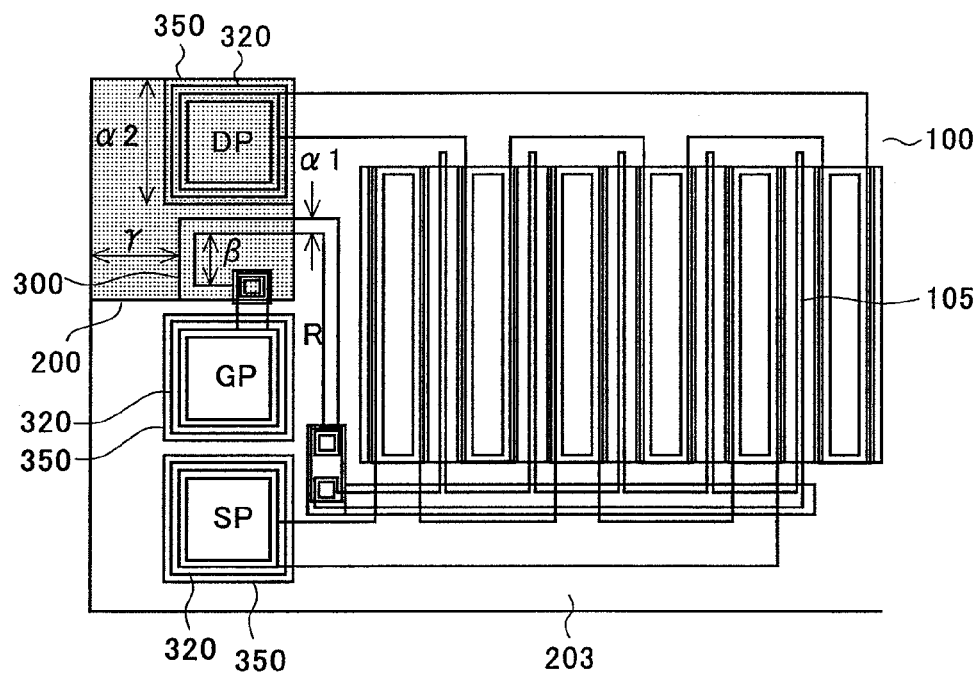
FIG. 26B is a plan view for describing this invention.

With the arrangement of FIG. 26B, a resistor R is likewise disposed adjacent a drain electrode DP so that the distance between an n⁺-type region that makes up the resistor R and the pad n⁺-type region 350 adjacent it will be 4 μm, and the protecting element 200 is arranged across the semi-insulating substrate 101. Likewise, a part of the resistor R is the first n⁺-type region 201 and a part of the pad n⁺-type region 350 below and at the periphery of drain electrode pad DP is the second n⁺-type region 202. The protecting element 200 is thus connected in parallel between the gate and drain terminals of the FET.

With this pattern, the width of the resistor R is α1 and is made 5 μm or less as well. Also, the other components are disposed upon securing 10 μm or more as the width β of insulating region 203 at the outer side of the resistor R that is to be the first n⁺-type region 201. However with the arrangement of FIG. 26B, the distance β is slightly shorter than that of FIG. 26A and the width with which 10 μm or more can be secured as is narrow. The current that flows through the current path I2 is made that much less in comparison to the arrangement of FIG. 26A. As a countermeasure, a part of the resistor R is bent to provide the extension part 300 and a region is secured to enable flow through the current path I3 between the n⁺ region 350 below and at the periphery of the drain pad. In the case of this pattern, the insulating region between the resistor extension part 300 and the chip edge and the insulating region between n⁺ region 350 below and at the periphery of the drain pad and the chip edge are the regions enabling flow through the current path I3. The protecting element 200 is formed with 10 μm or more being secured as the width γ of this region. That is, in comparison to the arrangement of FIG. 26A, with the arrangement of FIG. 26B, the current path I3, which does not exist with the arrangement of FIG. 26A, is formed to make up for the lesser amount of current that flows through the current path I2 and thereby provide adequate protection of the Schottky junction between the gate and drain of the GaAs MESFET against static electricity.

The protecting element 200 of this embodiment is thus disposed between two terminals, the part between which is to be the protected element, upon making the width of at least one of the high concentration impurity regions of the first $n^+$-type region 201 and the second $n^+$-type region 5 μm or less, and upon securing an adequate area of insulating region (β, γ) at the periphery.

Although cases where the insulating region 203 is GaAs were described as examples above, as mentioned above, the insulating region 203 may be a region (203b), which has been made insulating by implantation/diffusion of an impurity into a substrate, and in this case, this invention can be applied in likewise manner to a silicon substrate.

As described in detail above, this invention provides the following various effects.

Firstly, by connecting a protecting element, with a high concentration impurity region-insulating region-high concentration impurity region arrangement, in parallel between two terminals of a protected element containing a pn junction or a Schottky junction that undergoes electrostatic breakdown readily or a protected element that forms a capacitor, electrostatic energy that is applied from the outside can be bypassed. Since between the terminals to which the protecting element is connected, the electrostatic energy is discharged in the protecting element in the middle of the path leading to an operating region in which the junction or capacitor that is weak against electrostatic breakdown exists, the protected element can be protected from electrostatic breakdown.

Secondly, since the protecting element has a high concentration impurity region-insulating region-high concentration impurity region arrangement and does not have a PN junction, parasitic capacitor of the protecting element itself will not arise. The protecting element can thus be formed on the same substrate as the protected element with hardly any increase in parasitic capacitance and electrostatic breakdown can thus be prevented without degradation of high-frequency characteristics.

Thirdly, by connection of the protecting element, the electrostatic breakdown voltage between the two terminals between which the protected element show minimum electrostatic breakdown can be improved by 20V or more and made no less than 200V.

Fourthly, by connecting a protecting element adjacent a pad connected to a terminal of the protected element, electrostatic energy can be discharged immediately after its application, thereby contributing further to the improvement of the electrostatic breakdown voltage.

Fifthly, by connecting a protecting element in the middle of the path from a bonding pad connected to a terminal of a protected element to an operating region, a junction or a capacitor that is weak against electrostatic breakdown can be protected most effectively from electrostatic breakdown.

Sixthly, since unlike a protecting diode, with which electrostatic energy is discharged at the horizontal plane, electrostatic energy is discharged at the vertical plane with a protecting element, integration of the protecting element can be carried out while causing hardly any increase in the chip area.

Seventhly, with the protecting element 200, at least one of the high concentration impurity regions of the first $n^+$-type region 201 and the second $n^+$-type region, which are to be the terminals of the protecting element, is made 5 μm or less in width to form the second current path I2 in the insulating region 203, thereby distributing the electron current, hole current, and recombination over a wide range and increasing the conductivity modulation efficiency correspondingly.

Eighthly, since current flows across a wider range due to the second current path I2, the temperature decreases, the carrier mobilities increase correspondingly, and the current thus increases further.

Ninthly, since due to the second current path I2, the conductive modulation efficiency becomes higher and the current path spreads further the higher the voltage of the applied static electricity, the conductivity modulation effect can be adjusted automatically.

Tenthly, by making a high concentration impurity region, which is to be one of the terminals of the protecting element, 5 μm or less in width, current is made to flow deeper the higher the voltage of static electricity in the first current path I1, thus enabling automatic adjustment of the conductivity modulation effect as with the second current path I2.

Eleventhly, by adequately securing the insulating region 203 that will be the second current path I2, the electrostatic breakdown voltage can be improved by 20 times or more.

Twelfthly, with a b-structure, by securing 10 μm or more as the width β of the insulating region 203 at the outer side of the first $n^+$-type region 201, the second current path I2 can be made wider and the conductivity modulation effect can be increased further. Specifically, by securing 25 μm as β, a current of approximately 10 times can be made to flow in comparison to a protecting element of a-structure.

Thirteenthly, in case where an adequate β or δ or an adequate length of opposing surfaces OS cannot be secured due to the configuration on the chip, the extension part 300 is provided by bending the first $n^+$-type region 201 in an separating direction from opposing surfaces OS and an insulating region 203 of a width (γ) of 10 μm or more is secured between the extension part 300 and other components to form the third current path I3 that is to be a path for electron current and hole current of high conductivity modulation efficiency between the extension part 300 and the second $n^+$-type region 202.

An even larger current path can thereby be secured in the outer directions of the extension part 300 and the second $n^+$-type region 202. Since the third current path I3 is formed in the depth direction of the device as well, the current in the depth direction also increases.

The invention claimed is:

1. A protecting element comprising:
a first high concentration impurity region formed in an insulating region of a substrate and connected to a first terminal of an element formed in the substrate; and
a second high concentration impurity region formed in the insulating region and connected to a second terminal of the element, the first and second high concentration impurity regions facing each other with a portion of the insulating region disposed therebetween,
wherein upon discharging of electrostatic energy applied between the first and second terminals a current path is formed in the insulating region,
a width of the first high concentration impurity region is 5 μm or smaller such that the current path is formed from an outer side surface of the first high concentration impurity region to the second high concentration impurity region, the outer side surface of the first high concentration impurity region being opposite from an inner side surface of the first high concentration impurity region that faces the portion of the insulating region, and
a distance between a bottom surface of the first high concentration impurity region and a bottom surface of the insulating region is 20 μm or larger.

2. The protecting element of claim 1, wherein a width of the second high concentration impurity region is configured so that upon the discharging of the electrostatic energy applied between the first and second terminals the current path from the outer side surface of the first high concentration impurity region reaches an outer side surface of the second high concentration impurity region, the outer side surface of the second high concentration impurity region being opposite from an inner side surface of the second high concentration impurity region that faces the portion of the insulating region.

3. The protecting element of claim 2, wherein the width of the first high concentration impurity region and the width of the second high concentration impurity region are 5 μm or smaller.

4. The protecting element according to claim 1, wherein a separation of the first and second high concentration impurity regions is 10 μm or smaller.

5. The protecting element according to claim 1, wherein a separation of the first and second high concentration impurity regions is 4 μm or larger.

6. The protecting element according to claim 1, wherein an impurity concentration of the insulating region is $1\times10^{14}$ $cm^{-3}$ or lower.

7. The protecting element according to claim 1, wherein a volume resistivity of the insulating region is $1\times10^{3}$ Ωcm or higher.

8. The protecting element according to claim 1, wherein the insulating region is configured to provide an additional current path upon the discharging between the inner side surface of the first high concentration impurity region and an inner side surface of the second high concentration impurity region and between bottom surfaces of the first and second high concentration impurity regions.

9. The protecting element of claim 8, wherein the current path has a higher conductivity modulation than the additional current path.

10. The protecting element of claim 8, wherein a current running through the current path upon the discharging is greater than a current running through the additional current path upon the discharging.

11. The protecting element of claim 1, wherein the insulating region extends, in plan view of the protecting element, from the first high concentration impurity region by at least 10 μm in a direction perpendicular to the outer side surface of the first high concentration impurity region and away from the first high concentration impurity region.

12. The protecting element of claim 1, wherein the current path expands when the electrostatic energy applied between the first and second terminals becomes larger.

13. The protecting element of claim 1, wherein a capacitance between the first and second high concentration impurity regions is 40 fF or smaller.

14. The protecting element of claim 1, wherein the element comprises a PN junction or a Schottky junction, and in the insulating region extends, in plan view of the protecting element, from the first high concentration impurity region by at least 10 μm in a direction perpendicular to the outer side surface of the first high concentration impurity region and away from the first high concentration impurity region.

15. The protecting element of claim 1, wherein the first high concentration impurity region is connected to a first electrode of a capacitor, the second high concentration impurity region is connected to a second electrode of the capacitor, and in the insulating region extends, in plan view of the protecting element, from the first high concentration impurity region by at least 10 μm in a direction perpendicular to the outer side surface of the first high concentration impurity region and away from the first high concentration impurity region.

* * * * *